United States Patent
Hiroshima et al.

(10) Patent No.: US 8,906,249 B2
(45) Date of Patent: Dec. 9, 2014

(54) PLASMA PROCESSING APPARATUS AND PLASMA PROCESSING METHOD

(75) Inventors: Mitsuru Hiroshima, Osaka (JP); Hiromi Asakura, Hyogo (JP)

(73) Assignee: Panasonic Corporation, Osaka (JP)

( * ) Notice: Subject to any disclaimer, the term of this patent is extended or adjusted under 35 U.S.C. 154(b) by 1252 days.

(21) Appl. No.: 12/532,268

(22) PCT Filed: Mar. 19, 2008

(86) PCT No.: PCT/JP2008/000645
§ 371 (c)(1),
(2), (4) Date: Nov. 24, 2009

(87) PCT Pub. No.: WO2008/120459
PCT Pub. Date: Oct. 9, 2008

(65) Prior Publication Data
US 2010/0089870 A1  Apr. 15, 2010

(30) Foreign Application Priority Data

Mar. 22, 2007 (JP) ................. 2007-074500
Mar. 28, 2007 (JP) ................. 2007-083636
Mar. 30, 2007 (JP) ................. 2007-091735
Mar. 30, 2007 (JP) ................. 2007-091741

(51) Int. Cl.
*C03C 15/00* (2006.01)
*H01L 21/461* (2006.01)
*H01J 37/32* (2006.01)
*C23C 16/455* (2006.01)
*H05H 1/46* (2006.01)
*C23C 16/507* (2006.01)

(52) U.S. Cl.
CPC ................ *H05H 1/46* (2013.01); *H01J 37/321* (2013.01); *C23C 16/4558* (2013.01); *C23C 16/507* (2013.01); *H01J 37/3244* (2013.01); *C23C 16/45574* (2013.01)
USPC ............................................. 216/68; 438/710

(58) Field of Classification Search
CPC ............ H01L 21/3065; H01L 21/3083; H01L 21/32136; H01L 21/67063; H01L 21/67069; H01J 37/3244; H01J 37/321; H01J 37/32449
USPC .............. 216/68; 427/569; 438/710, 758, 788
See application file for complete search history.

(56) References Cited

U.S. PATENT DOCUMENTS 5,982,100 A * 11/1999 Ghanbari ................. 315/111.21
6,143,078 A * 11/2000 Ishikawa et al. ............. 118/715
(Continued)

FOREIGN PATENT DOCUMENTS

CN         1794431        6/2006
JP         10-209116      8/1998
(Continued)

OTHER PUBLICATIONS

International Preliminary Report on Patentability issued Oct. 1, 2009 in International (PCT) Application No. PCT/JP2008/000645.

*Primary Examiner* — Luz Alejandro Mulero
(74) *Attorney, Agent, or Firm* — Wenderoth, Lind & Ponack, L.L.P.

(57) ABSTRACT

A plasma processing apparatus includes a beam-shaped spacer 7 which is placed at an upper opening of a chamber 3 opposed to a substrate 2 to support a dielectric plate 8. The dielectric plate 8 is supported by the beam-shaped spacer 7. In the beam-shaped spacer 7 are provided a plurality of process gas introducing ports 31, 36 which have a depression angle θd and which are provided downward and directed toward the substrate 2, as well as a plurality of rare gas introducing ports 41 having a elevation angle θe directed toward the dielectric plate 8. Improvement of processing rates such as etching rate as well as effective suppression of wear of the dielectric plate 8 can be achieved.

3 Claims, 30 Drawing Sheets

(56) References Cited

U.S. PATENT DOCUMENTS

| | | |
|---|---|---|
| 6,185,839 B1 | 2/2001 | Kholodenko et al. |
| 6,331,754 B1 | 12/2001 | Satoyoshi et al. |
| 6,449,871 B1 | 9/2002 | Kholodenko et al. |
| 6,830,652 B1 | 12/2004 | Ohmi et al. |
| 2004/0168769 A1 | 9/2004 | Matsuoka et al. |
| 2006/0137611 A1 | 6/2006 | Choe et al. |

FOREIGN PATENT DOCUMENTS

| | | |
|---|---|---|
| JP | 11-260810 | 9/1999 |
| JP | 2001-110577 | 4/2001 |
| JP | 2001-110777 | 4/2001 |
| JP | 2002-517086 | 6/2002 |
| JP | 2002-289578 | 10/2002 |
| JP | 3384795 | 12/2002 |
| JP | 2003-68723 | 3/2003 |
| JP | 2003-332326 | 11/2003 |
| JP | 2004-193148 | 7/2004 |
| JP | 2004-356651 | 12/2004 |
| JP | 2005-122939 | 5/2005 |
| JP | 3729939 | 10/2005 |
| JP | 2006-73354 | 3/2006 |
| JP | 2006-185921 | 7/2006 |
| KR | 10-2006-0073737 | 6/2006 |
| TW | 473775 | 1/2002 |
| WO | 99/62099 | 12/1999 |

* cited by examiner

*Fig.32A* GAS PRESSURE
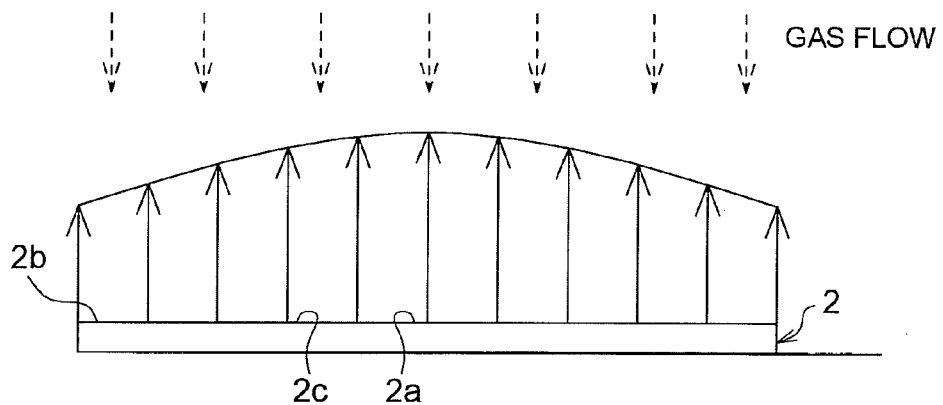
*Fig.32B*
RESIDENCE TIME OF GAS (REACTION PRODUCTS)
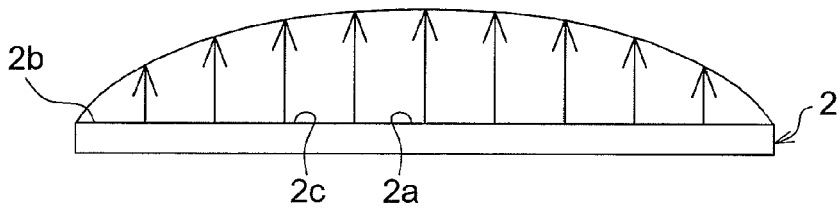
*Fig.32C*
REDEPOSITION AMOUNT OF REACTION PRODUCTS
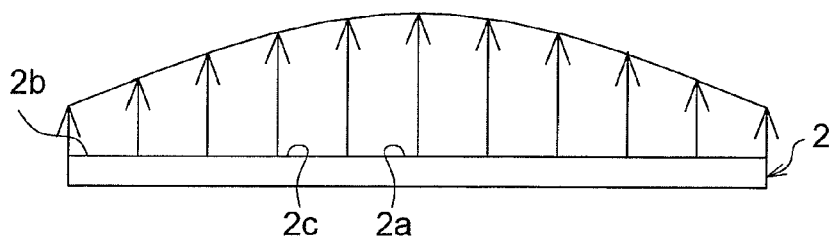
*Fig.32D*
ETCHING RATE
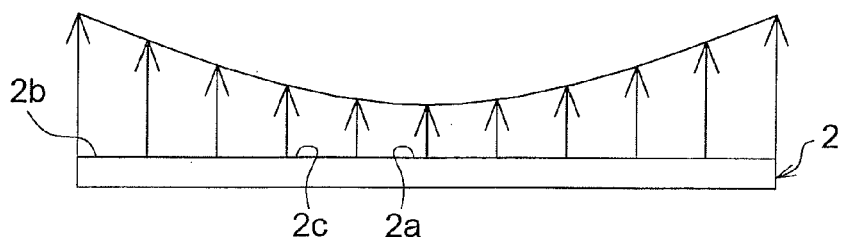

GAS PRESSURE

RESIDENCE TIME OF GAS (REACTION PRODUCTS)

REDEPOSITION AMOUNT OF REACTION PRODUCTS

ETCHING RATE

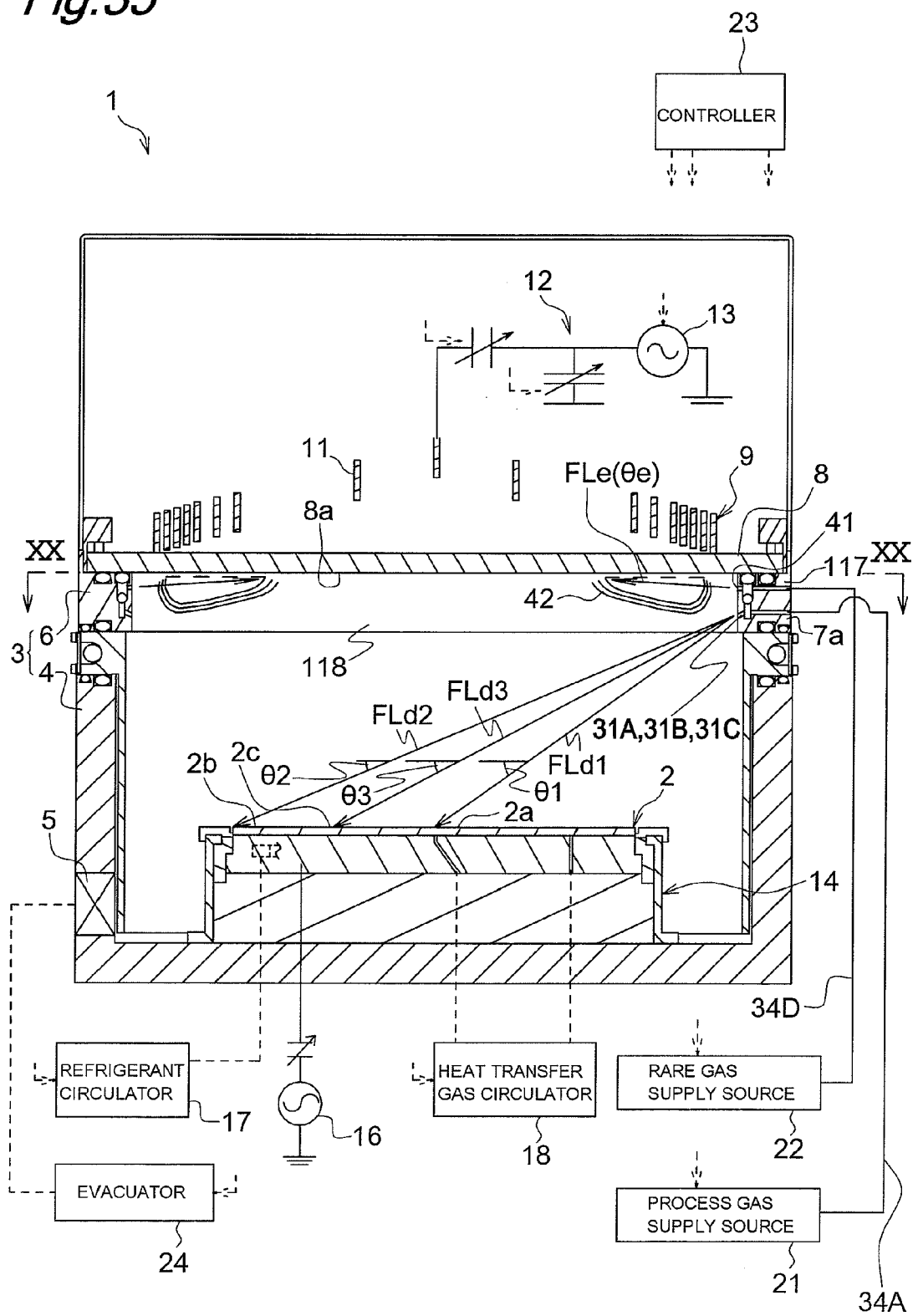

PLASMA PROCESSING APPARATUS AND PLASMA PROCESSING METHOD

TECHNICAL FIELD

The present invention relates to a plasma processing apparatus, as well as a plasma processing method, such as dry etching apparatus and plasma CVD apparatus.

BACKGROUND ART

In a plasma processing apparatus of the inductively coupled plasma (ICP) type, a construction that an upper portion of the chamber is closed with a dielectric plate, and a coil to which a radio frequency power is applied is placed on the dielectric plate is known. For example, Patent Literatures 1 to 3 disclose plasma processing apparatuses in which the dielectric plate is reduced in thickness while the mechanical strength is secured by supporting the lower surface side of the dielectric plate with a beam-shaped structure. Also, Patent Literatures 4 and 5 disclose constructions for supplying gas from a dielectric-plate supporting structure.

In these plasma processing apparatuses, since the dielectric plate is thin and the beam-shaped structure is so shaped as to reduce interaction with the coil, a high-density plasma can be generated.

In recent years, in order to subject a Si substrate to deep Si etching, i.e. deep dipping, high-aspect etching or the like at high speed, it is desired to further increase the plasma density, for example, by increasing the internal pressure of the plasma processing apparatus to, for example, about 10 Pa or higher and moreover increasing the applied radio frequency power.

However, such high-pressure, high-power Si etching process as shown above would involve very considerable etching or wear of the dielectric plate made of quartz. In conventionally proposed plasma processing apparatuses including those disclosed in Patent Literatures 1 to 5, not enough considerations are given to effective suppression of etching or wear of the dielectric plate based on the process characteristics of such high-pressure, high-power, process.

Generally, the gas flow state can be classified into a molecular flow region under low pressure (high degree of vacuum), a viscous flow region under high pressure (low degree of vacuum), and an intermediate flow region being an intermediate region between the molecular flow region and the viscous flow region. In a plasma processing (hereinafter, referred to as "high-pressure process") under such a high pressure that the gas flow falls within a range from the intermediate flow region of the molecular flow region and the viscous flow region to the viscous flow region, the gas flow tends to be more viscous so that the position of a gas introducing port and the introduction method affect the etching characteristics to more extent, in comparison to a plasma processing (hereinafter, referred to as "low-pressure process") under such a high pressure that the gas flow falls within the molecular flow region. In the high-pressure process, for example, a relative positional relationship between a process gas flow and a high plasma density region largely affects the efficiency of plasma generation from the process gas. Also in the high-pressure process, a relative positional relationship between the process gas flow and the substrate largely affects the amount of radicals or ions fed to the substrate as well as their in-plane distribution. However, in conventionally proposed plasma processing apparatuses including those disclosed in Patent Literatures 1 to 5, not enough considerations are given to improvement of the processing rate such as etching rate based on the characteristics of the high-pressure process, as well as to uniformization of processing characteristics such as etching rate distribution.

Patent Literature 1: JP 3384795 B
Patent Literature 2: JP 3729939 B
Patent Literature 3: JP 2001-110577 A
Patent Literature 4: JP 2005-122939 A
Patent Literature 5: JP 2003-332326 A

DISCLOSURE OF THE INVENTION

Problems to be Solved by the Invention

An object of the present invention is to provide a high-pressure, high-power, ultrahigh-density plasma generation process capable of achieving improvement of etching rate or other processing rates, effective suppression of wear of the dielectric plate, and uniformization of etching rate distribution or other processing characteristics.

Means for Solving the Problems

In order to accomplish the first object, in a first aspect of the invention, there is provided a plasma processing apparatus comprising: a vacuum vessel (3) in which a substrate (2) is placed; a beam-shaped structure (7) which is placed at an upper opening of the vacuum vessel opposed to the substrate and which has an annular outer peripheral portion (7a) with a lower surface (7d) supported by the vacuum vessel, a central portion (7b) located at a center of a region surrounded by the outer peripheral portion in plane view, and a plurality of beam portions (7c) extending radially from the central portion to the outer peripheral portion, and in which regions surrounded by the outer peripheral portion, the central portion and the beam portions constitute window portions (30); a dielectric plate (8) whose lower surface (8a) is supported by an upper surface (7g) of the beam-shaped structure; a spiral coil (9) which is formed of a plurality of conductors (11) spirally arranged on an upper surface side of the dielectric plate and to which a radio frequency power is applied; a plurality of process gas introducing ports (31, 36, 71, 73) provided in the beam-shaped structure so as to face downward and each have a depression angle directed toward the substrate; a process gas supply source (21) for supplying a process gas to the process gas introducing ports for injecting the gas; a plurality of antiwear gas introducing ports (41, 61, 62, 141) provided so as to face upward and confront the window portions of the beam-shaped structure and to each have an elevation angle directed toward the dielectric plate; and an antiwear gas supply sources (22, 142) for supplying an antiwear gas to the antiwear gas introducing ports for injecting the antiwear gas.

Herein, the terms 'depression angle' and 'elevation angle' in relation to the first and second gas introducing ports refer to an angle that a direction of a gas introducing port forms against the horizontal direction within a vertical plane, where a direction in which the gas is injected from a gas introducing port also has this angle against the horizontal direction within the vertical plane. Also, among angles against the horizontal direction within the vertical plane, a downward angle is referred to as a depression angle and an upward angle is referred to as an elevation angle.

Preferably, the process gas introducing ports are provided in a surface (7j) of the beam-shaped structure facing the window portions of the outer peripheral portion.

In a region near the lower surface of the dielectric plate corresponding to the outer peripheral side of the spiral coil, i.e., in a region of the window portion near the outer peripheral portion of the beam-shaped structure in plane view, a strong radio frequency magnetic field is generated, causing electrons to be heated, so that a doughnut-shaped high-density plasma region is generated. The process gas introducing ports are provided in the surface of the beam-shaped structure confronting the window portion of the outer peripheral portion. In other words, the process gas injected from vicinities of the doughnut-shaped high-density plasma into the vacuum vessel. As a result, plasma generation of the process gas is effectively accelerated. Also, since the dielectric plate is supported by the beam-shaped structure which includes an annular outer peripheral portion with the lower surface supported by the vacuum vessel, a central portion located at the center of the region surrounded by the outer peripheral portion in plane view, and a plurality of beam portions extending radially from the central portion to the outer peripheral portion, the dielectric plate can be reduced in thickness while the mechanical strength is secured in consideration of deformation of the dielectric plate involved in pressure reduction of the interior of the vacuum vessel. As a result, the loss of applied radio frequency power can be largely reduced so that the plasma can be further densified. Because of these reasons, the processing rate such as etching rate of the substrate can be improved.

The antiwear gas introducing ports each have the elevation angle directed toward a high-density plasma generation region formed near the lower surface of the dielectric plate.

Concretely, the antiwear gas supply source is a rare gas supply source (22) for supplying a rare gas to the antiwear gas introducing ports for injecting the rare gas. The rare gas contains at least one kind selected from a group of helium, argon, xenon and neon.

The plasma processing apparatus includes an oxygen gas supply source (142) for supplying oxygen gas ($O_2$) to the second gas introducing port for injecting the oxygen gas, as the second gas supply source, instead of the rare gas supply source or in addition to the rare gas supply source.

In the region corresponding to the outer peripheral side of the spiral coil in the neighborhood of the lower surface of the dielectric plate, high-density plasma is generated as described above. The gas for prevention of cuts of the lower surface of the dielectric plate is blown from the antiwear gas introducing ports toward the high-density plasma generation region. Selection of the gas to be blown from the antiwear gas introducing ports needs to satisfy a condition of low reactivity with the material of the dielectric plate from the viewpoint of prevention of cuts of the dielectric plate. For example, when the dielectric plate is made of quartz ($SiO_2$), the relevant gas to be blown is He, Ar or other rare gas and/or $O_2$. Also, the gas blown from the second gas introducing port is preferably selected in terms of etching by the condition that the gas is contained in the process gas necessary for etching of the substrate material, and/or by the condition that the gas is a rare gas (containing at least one kind selected from a group of He, Ar, Xe and Ne) occupying a large ratio to a total flow rate. For example, if the dielectric plate is made of $SiO_2$ and the etching-targeted film is made of Si and the mixed gas of the process gas and the rare gas is $SF_6/O_2/H_e$, then the gas to be blown for prevention of cuts of the dielectric plate is preferably selected as at least one of $O_2$ and He, which is a rare gas. Further, if the dielectric plate is made of $SiO_2$ and the etching-targeted film is made of Si and the mixed gas of the process gas and the rare gas is $SF_6/O_2$, which contains no rare gas (He), then the gas to be blown for prevention of cuts of the dielectric plate 8 is preferably selected as $O_2$ gas. Besides, if the dielectric plate is made of $SiO_2$ and the etching-targeted film is made of $SiO_2$ and the mixed gas of the process gas and the rare gas is $CF_4/Ar$, then the gas to be blown for prevention of cuts of the dielectric plate is preferably selected as Ar, which is a rare gas.

Injecting the rare gas from the antiwear gas introducing port causes the partial pressure of the rare gas to become relatively higher immediately under the dielectric plate, as compared with the other regions in the vacuum vessel. That is, the rare gas immediately under the dielectric plate becomes higher in gas density. Since the rare gas is extremely low in reactivity, etching or wear of the lower surface of the dielectric plate is effectively suppressed or prevented. Similarly, when the process gas contains oxygen gas, injecting the oxygen gas from the antiwear gas introducing ports causes the partial pressure of the oxygen gas to become relatively higher in the high-density plasma generation region immediately under the dielectric plate, so that the dielectric plate, if made of quartz ($SiO_2$), is hardly chipped even with $O_2$ plasma applied thereto. Also, since the oxygen gas can be used as the etching gas for the substrate, oxygen gas may be used as the gas to be blown from the second gas introducing port within a range permissible for the etching of the substrate.

As an example, the antiwear gas introducing ports are provided in a surface (7j) of the beam-shaped structure facing the window portion of the outer peripheral portion.

The surface of the beam-shaped structure facing the window portion of the outer peripheral portion is close to a region of the dielectric plate corresponding to the outer peripheral side of the spiral coil near the lower surface, i.e., close to a region where the high-density plasma generation region is formed, etching or wear of the lower surface of the dielectric plate can be suppressed more effectively by the injection of the rare gas or oxygen gas.

Preferably, the plasma processing apparatus includes a plurality of introducing port members (43, 37) which are replaceably mounted on the beam-shaped structure and in which either one of the process gas introducing port or the antiwear gas introducing port is formed.

Replacing the introducing port member allows the elevation angle or opening area of the second gas introducing port can easily be changed. By a change of the elevation angle or opening area, wear of the dielectric plate can effectively be suppressed in event of changes in the process conditions.

In a second aspect of the invention, there is provided a plasma processing method for processing a substrate (2) by plasma, comprising: providing the substrate on a bottom portion side of a vacuum vessel (3); providing a beam-shaped structure (7) at an upper opening of the vacuum vessel opposed to the substrate, the beam-shaped structure having an annular outer peripheral portion (7a) with a lower surface (7d) supported by the vacuum vessel, a central portion (7b) located at a center of a region surrounded by the outer peripheral portion in plane view, and a plurality of beam portions (7c) extending radially from the central portion to the outer peripheral portion, wherein regions surrounded by the outer peripheral portion, the central portion and the beam portions constitute window portions (30); providing a dielectric plate (8) so that its lower surface (8a) is supported by an upper surface (7g) of the beam-shaped structure; providing a spiral coil (9) for plasma generation on an upper surface side of the dielectric plate; injecting a process gas into the vacuum from a plurality of process gas introducing ports (31, 36) provided in the beam-shaped structure so as to face downward and each have a depression angle directed toward the substrate; injecting an antiwear gas toward a lower surface of the dielectric plate from a plurality of antiwear gas introducing ports (41, 56) which are provided so as to face upward and confront the window portion of the beam-shaped structure and each of which has an elevation angle directed toward the dielectric plate; while injecting the process gas from the process gas introducing ports and injecting the antiwear gas from the antiwear gas introducing ports, evacuating interior of the vacuum vessel to maintain the interior of the vacuum vessel at a constant pressure; and applying a radio frequency power to the spiral coil to generate plasma in the vacuum vessel to fulfill processing of the substrate.

Effects of the Invention

According to the plasma processing apparatus and plasma processing method of the present invention, the dielectric plate is supported by the beam-shaped structure which includes an annular outer peripheral portion, a central portion located at the center of the region surrounded by the outer peripheral portion, and a plurality of beam portions extending radially from the central portion to the outer peripheral portion, and moreover the apparatus includes a first gas introducing port having a depression angle directed toward the substrate to inject the process gas, as well as a plurality of second gas introducing ports each having an elevation angle directed toward the dielectric plate to inject either one of a rare gas or oxygen gas. Thus, the plasma processing apparatus and plasma processing method are enabled to achieve improvement of processing rates such as etching rate as well as effective suppression of wear of the dielectric plate.

Also, since a plurality of process gas introducing ports provided in the surface of the beam-shaped structure facing the window portion of its outer peripheral portion include those having at least two kinds of depression angles, the plasma processing apparatus and plasma processing method are enabled to achieve improvement of the processing rate such as etching rate as well as uniformization of the processing characteristics such as etching rate distribution.

BRIEF DESCRIPTION OF THE DRAWINGS

FIG. 32A is a view of an in-plane distribution of gas pressure with a uniform process gas flow given to the substrate;
FIG. 32B is a view of an in-plane distribution of gas residence time with a uniform process gas flow given to the substrate;
FIG. 32C is a view of an in-plane distribution of reactant redeposition amount with a uniform process gas flow given to the substrate;
FIG. 32D is a view of an in-plane distribution of etching rate with a uniform process gas flow given to the substrate.

FIG. 35 is a schematic sectional view of a dry etching apparatus according to the seventh embodiment of the invention.

DESCRIPTION OF REFERENCE SIGNS

Figure 1:
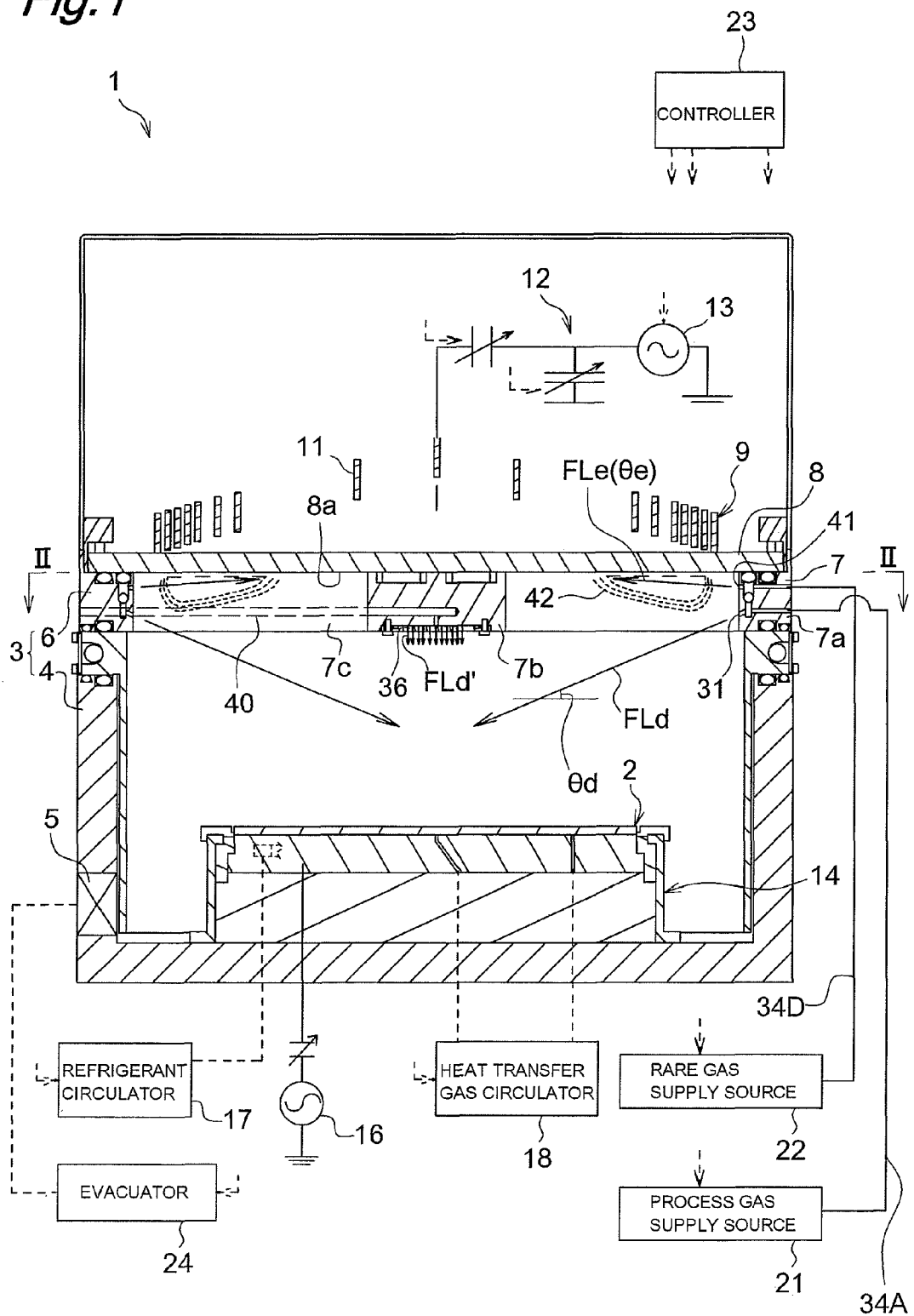
FIG. 1 is a schematic sectional view of a dry etching apparatus according to a first embodiment of the present invention.

1: Dry etching apparatus; 2: Substrate; 3: Chamber; 4 Chamber main body; 5: Exhaust port; 6: Lid; 7: Beam-shaped spacer; 7a: Outer peripheral portion; 7b: Central portion; 7c: Beam portion; 7d: Lower surface; 7e, 7f: Groove; 7g: Upper surface; 7h: Groove; 7i: Recess portion; 7j: Inner side wall surface; 7k: Gas passage groove; 7m: First portion; 7n: Second portion; 7p: Housing recess portion; 8: Dielectric plate; 8a: Lower surface; 9: ICP coil; 11: Conductor; 12: Matching circuit; 13, 16: Radio frequency power source; 14: Substrate susceptor; 17: Refrigerant circulator; 18: Heat transfer gas circulator; 21: Process gas supply source; 22: Rare gas supply source; 23: Controller; 24: Evacuator; 25A, 25B; O-ring; 26, 27, 28: O-ring; 29: Elastic member; 30: Window portion; 31, 36, 71, 73: Process gas introducing port; 33A, 33B: Annular gas passage; 33a: Inner peripheral wall; 33b: Outer peripheral wall; 34A, 34B: Introducing passage; 37: Introducing port plate; 37a: Through hole; 37b: Upper surface; 37c: recess portion; 37d: Lower surface; 37e: Annular groove; 38: Gas distribution chamber; 39: Inlet gas passage; 40: Gas passage; 41: Rare gas introducing port; 42: High-density plasma generation region; 43: Rare gas introducing port chip; 43a: Male screw portion; 43b: Head portion; 43c: Recess portion 43c; 44: Process gas introducing port chip; 50: Fitting hole; 50a: Inlet portion; 50b: Female screw portion; 50c: Outlet portion; 50d, 50e; Seat portion; 51: screw; 52: O-ring; 61, 62; Rare gas introducing port; 72: Gas passage; 141: Oxygen gas introducing port; 142: Oxygen gas supply source

DETAILED DESCRIPTION OF THE PREFERRED EMBODIMENTS

Reasons that, in high-pressure, high-power Si etching process, a dielectric plate made of quartz undergoes very considerable etching or wear will be described below.

First, the electrical conductivity σ of plasma can be expressed as a function of electron density $n_e$ as shown by Equation (1) below. The conductivity σ of plasma shows a positive correlation to the electron density $n_e$.

$$\sigma = f(n_e) \quad (1)$$

Next, skin depth δ (a distance in plasma to which a magnetic field generated by a coil is allowed to enter) can be expressed as a function of plasma conductivity σ as shown by Equation (2) below. In Equation (2), symbol ω denotes a frequency of radio frequency power and $\mu_0$ denotes a magnetic permeability of a vacuum.

$$\delta = \sqrt{\frac{2}{\omega \mu_0 \sigma}} \quad (2)$$

Generally, as the internal pressure of the vacuum vessel goes higher, the gas density increases, causing the electrodes-to-neutral particle collision frequency to increase so that the plasma conductivity is increased. As clearly seen from Equation (2), as the plasma conductivity σ increases, the skin depth δ decreases (e.g., to several centimeters or less). As a result, there is a tendency that high-density plasma continues to be generated as it is confined in a neighborhood of the lower surface of the dielectric plate. That is, it can be said that the skin depth δ has a negative correlation with pressure.

Figure 34:
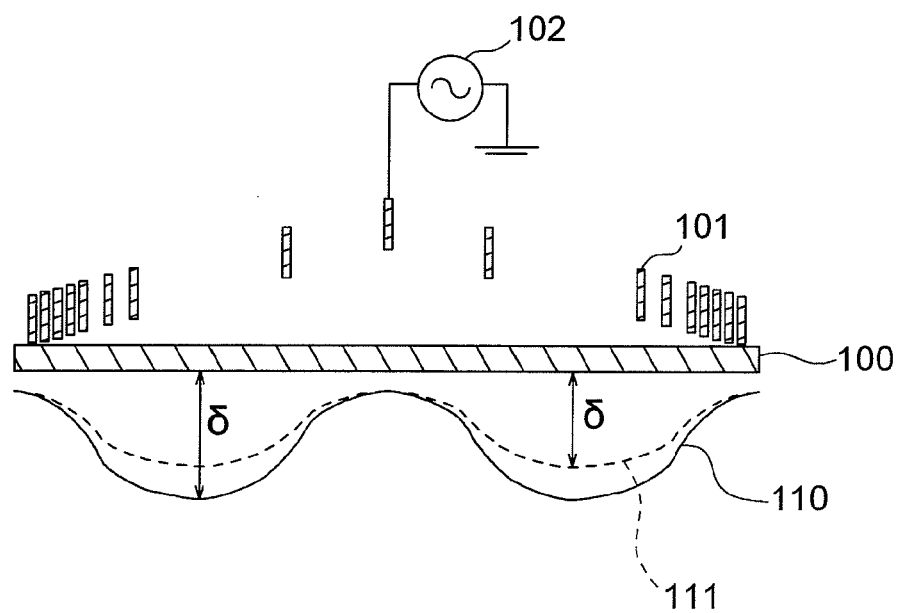
FIG. 34 is a schematic view for explaining variations in skin depth.

FIG. 34 schematically shows the skin depth δ. In this FIG. 34, coils 101 are placed above a dielectric plate 100, and radio frequency power is applied from a radio frequency power source 102 to the coils 101. A solid line 110 and a broken line 111 represent skin depths δ. The broken line 111 represents a case in which the electron density $n_e$ is increased with the skin depth δ decreased, compared with the case of the solid line 110.

Further, as the radio frequency power applied to the coils 101 is increased, the electron density $n_e$ increases, causing the plasma conductivity σ to increase, so that the skin depth δ decreases.

That is, from a first viewpoint, the skin depth δ is decreased by either increases in pressure or increases in radio frequency power, and the high-density plasma continues to be generated as it is confined in a neighborhood of the lower surface of the dielectric plate 100.

From a second viewpoint, generally, as the electron density $n_e$ is increased by increases in the radio frequency power applied to the coils 101 or elevation of the internal pressure of the vacuum vessel, a vertical-direction field component due to capacitive coupling is increased. As a result, ions in the plasma are accelerated to more extent, the ions tend to more intensely attack the lower surface of the dielectric plate 100.

As described above, generally, as the radio frequency power applied to the coils 101 is increased or the internal pressure of the vacuum vessel is elevated higher, there occur a tendency that high-density plasma continues to be generated as it is confined in a neighborhood of the lower surface of the dielectric plate 100 as well as a tendency that the accelerated ions more intensely attack the lower surface of the dielectric plate 100. Thus, in the high-pressure, high-power process, the dielectric plate 100 undergoes more considerable etching or wear.

First Embodiment

Figure 2:
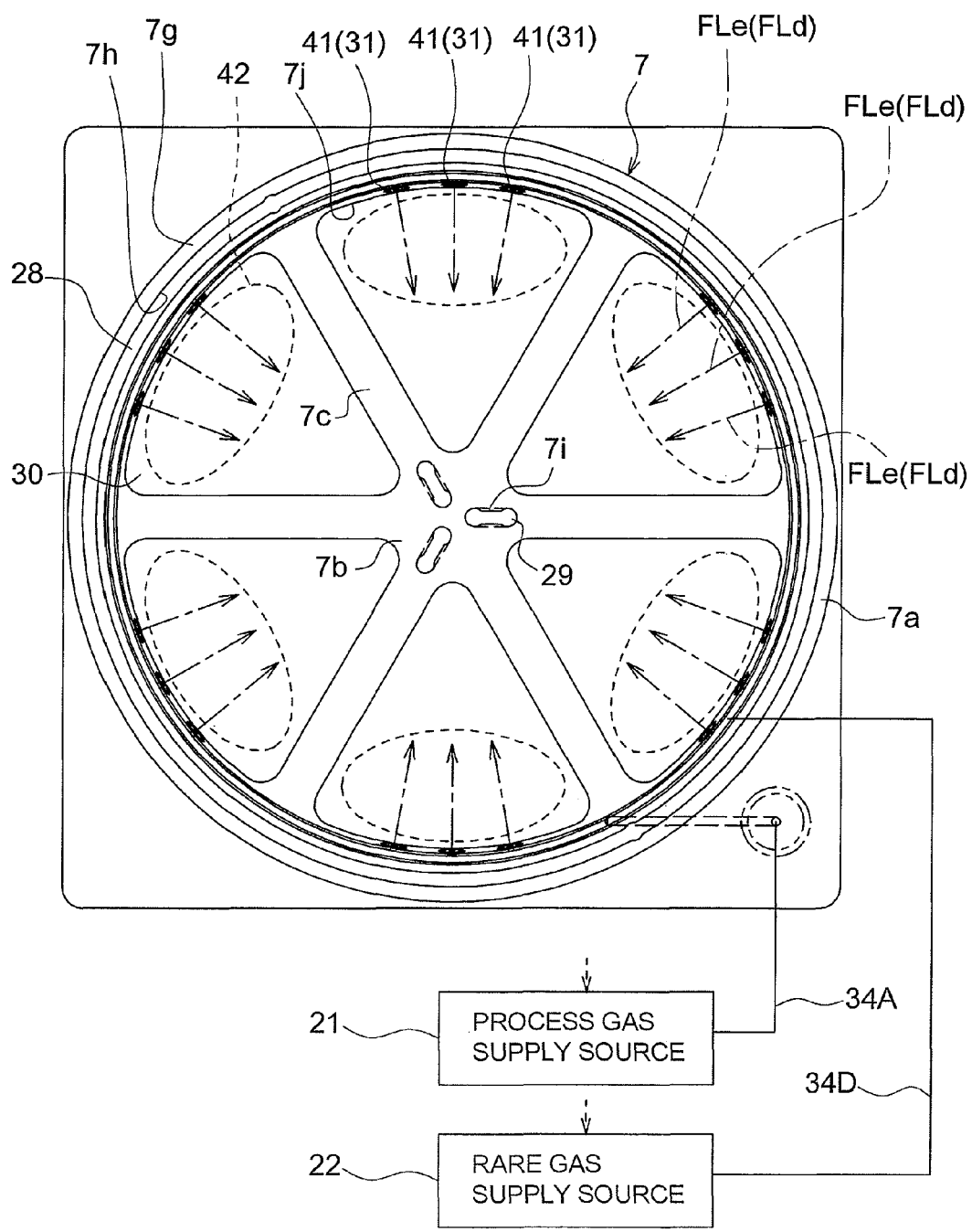
FIG. 2 is a sectional view taken along the line II-II of FIG. 1.

FIGS. 1 and 2 show a dry etching apparatus 1 of ICP (Inductively Coupled Plasma) type according to an embodiment of the present invention. The dry etching apparatus 1 has a chamber (vacuum vessel) 3 that constitutes a processing chamber in which a substrate 2 is housed. The chamber 3 has a chamber main body 4 whose upper part is opened, and a lid 6 that seals the upper opening of the chamber main body 4. The chamber main body 4 is provided with a gate (not shown) for carrying in and out the substrate 2. The lid 6 has a beam-shaped spacer (beam-shaped structure) 7 supported by the upper end of the side wall of the chamber main body 4, and a disc-shaped dielectric plate 8 that functions as a top plate supported by the beam-shaped spacer 7.

In this embodiment, the target substrate 2 is made of silicon, and the dry etching apparatus 1 executes about 10 Pa or higher high-pressure (low degree of vacuum), high-power, ultrahigh-density plasma generation process for etching the silicon substrate at a high aspect ratio and high speed. As will be detailed later, the dry etching apparatus 1 of this embodiment makes it possible to achieve improvement of the etching rate of the substrate 2 as well as effective suppression of etching or wear of the dielectric plate 8 in the high-pressure, high-power, ultrahigh-density plasma generation process.

The beam-shaped spacer 7 is made of a metal material of aluminum, stainless steel (SUS) or the like having a sufficient rigidity. The beam-shaped spacer 7 may be subjected to surface treatment for improving the wear resistance such as aluminum-alumite treatment, yttrium oxide thermal spraying or the like.

In this embodiment, the dielectric material from which the dielectric plate 8 is formed is quartz (SiO$_2$). However, the dielectric plate 8 may be formed of another dielectric material such as yttrium oxide (Y$_2$O$_3$), aluminum nitride (AlN) or alumina (Al$_2$O$_3$). Quartz is preferable in that contaminations in event of cuts or wear less affect the process, as compared with yttrium oxide or aluminum nitride. Quartz is inferior to yttrium oxide and aluminum nitride in terms of wear resistance and etching resistance. However, etching of the dielectric plate 8 made of quartz is effectively suppressed by injection of the rare gas from later-detailed rare gas introducing ports 41.

Figure 3:
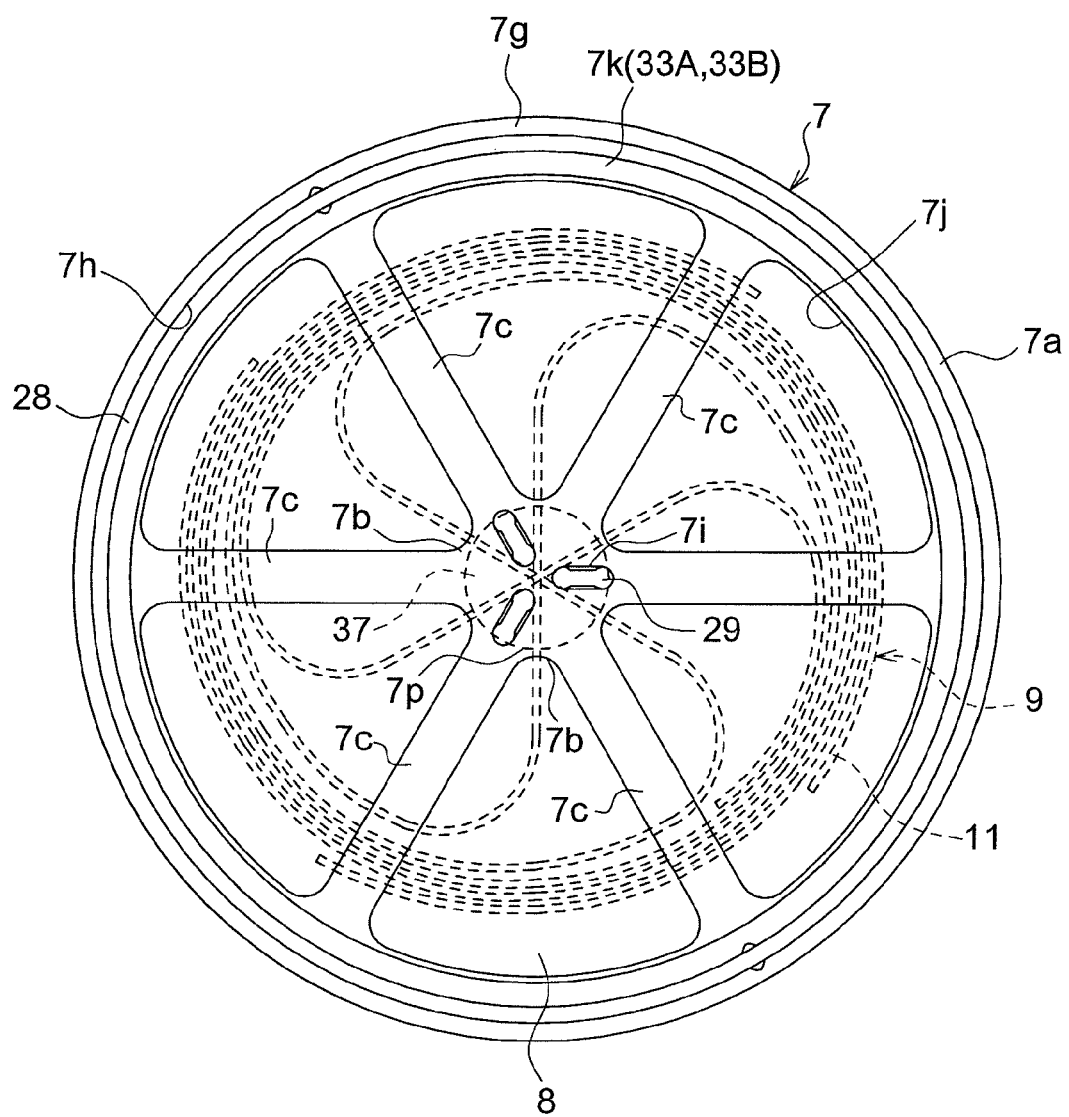
FIG. 3 is a schematic plan view showing a beam-shaped spacer and an ICP coil.
Figure 4:
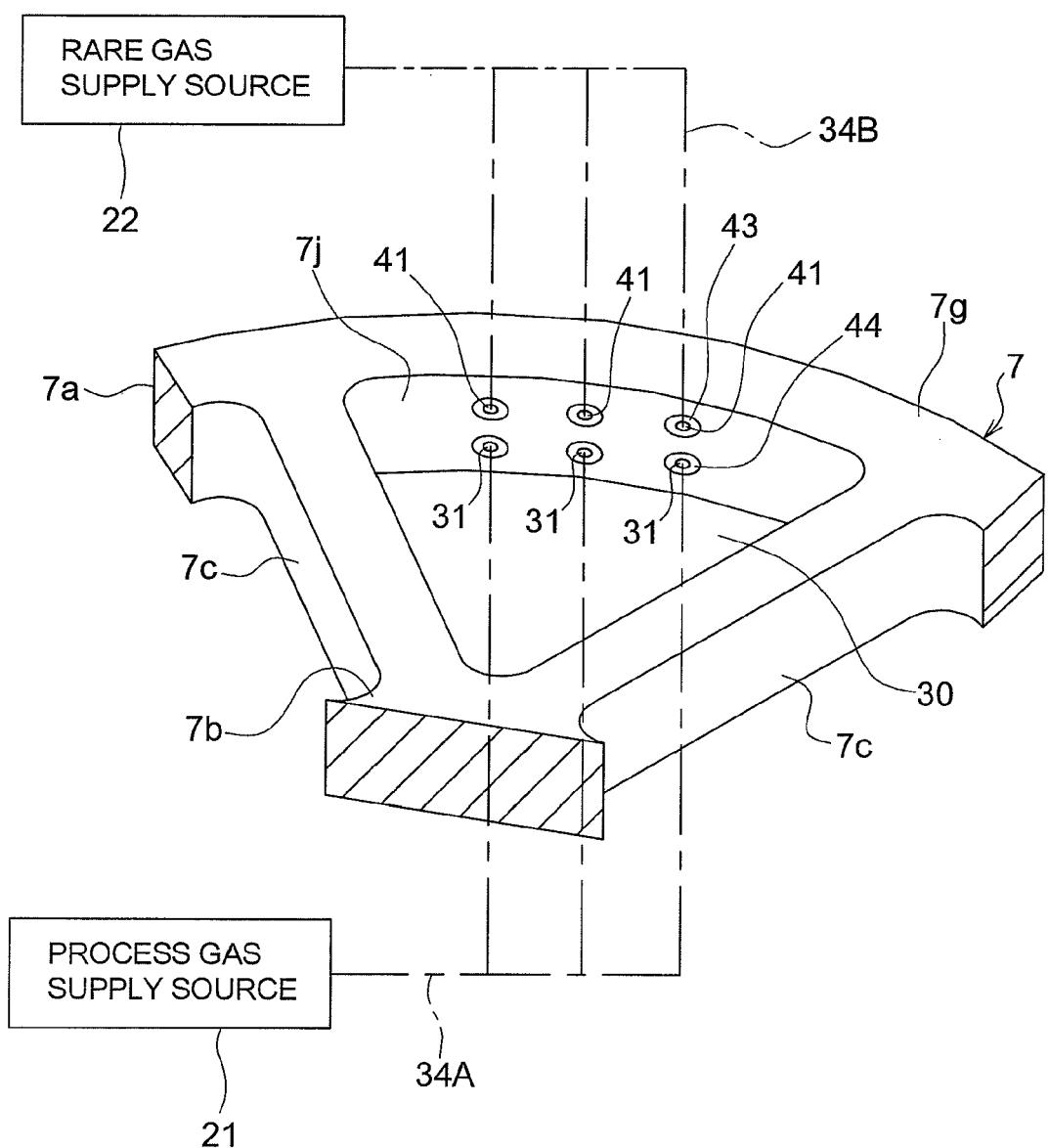
FIG. 4 is a schematic partial perspective view showing the beam-shaped spacer.

An ICP coil 9, which is a multi-spiral coil, is provided on an upper surface side of the dielectric plate 8. As shown in FIG. 3, the ICP coil 9 is formed of a plurality (six in the present embodiment) of conductors 11 that extend spirally from the center toward the outer periphery of the dielectric plate 8 in plane view. A portion (turn starting portion) corresponding to the center of the dielectric plate 8 in plane view, an interval between adjoining conductors 11 is large. In other words, the turn density of the conductors 11 is coarse in the portion corresponding to the center of the dielectric plate 8. In contrast to this, in a portion corresponding to the outer periphery of the dielectric plate 8 in plane view, an interval between adjoining conductors 11 is narrow, and the turn density is dense. A radio frequency power source 13 is electrically connected to the ICP coil 9 via a matching circuit 12.

A substrate susceptor 14 that has a function as a lower electrode to which a bias voltage is applied and a function to retain the substrate 2 by electrostatic attraction or the like is provided on the bottom side in the chamber 3 opposed to the dielectric plate 8 and the beam-shaped spacer 7. A radio frequency power is applied to the substrate susceptor 14 from a radio frequency power source 16 for biasing. Moreover, a refrigerant circulation passage is provided in the substrate susceptor 14, and a temperature-controlled refrigerant supplied from a refrigerant circulator 17 circulates in the circulation passage. Further, a heat transfer gas circulator 18 that supplies a heat transfer gas to a minute gap between the upper surface of the substrate susceptor 14 and the back surface of the substrate 2 is provided.

The dry etching apparatus 1 includes a process gas supply source 21 for supplying a process gas, which is a gas necessary for etching of the substrate 2, to process gas introducing ports 31, 36 formed in the beam-shaped spacer 7 for injecting the process gas in the chamber 3 toward the substrate 2, and a rare gas supply source (antiwear gas supply source) 22 for supplying a rare gas to rare gas introducing ports (antiwear gas introducing ports) 41 formed in the beam-shaped spacer 7 for injecting the rare gas within the chamber 3 toward the dielectric plate 8. The process gas introducing ports 31, 36 and the rare gas introducing ports 41 will be detailed later. In addition, although supply sources for the process gas and the rare gas are provided independently of each other in this embodiment, it is also allowable to provide a rare gas supply source and a process gas supply source for supplying a gas containing a process gas and a rare gas.

A controller 23 controls operations of the whole apparatus including the radio frequency power sources 13, 16, the heat transfer gas circulator 18, the refrigerant circulator 17, the process gas supply source 21, and the rare gas supply source 22.

The chamber 3 is internally evacuated by an evacuator 24 connected via an exhaust port 5. Then, while a process gas (etching gas) is introduced from a process gas supply source 21 via process gas introducing ports 31, 36 (arrow FLd, FLd'), gas exhaustion is effected by the evacuator 24 through the exhaust port 5, so that the interior of the chamber 3 is maintained at about 10 Pa or higher high pressure (low degree of vacuum). In this embodiment, in which the etching-target substrate 2 is made of silicon, the process gas to be used is a mixed gas of sulfur hexafluoride (SF$_6$), oxygen (O$_2$) and helium (He), as an example. Next, a radio frequency power is applied from the radio frequency power source 13 to the ICP coil 9, by which plasma is generated in the chamber 3. Ions in the plasma are accelerated by a self-bias voltage generated by the application of radio frequency power from the radio frequency power source 16 to the substrate susceptor 14, so that radicals are adsorbed to the substrate 2 while ions collide with the substrate 2, with the result that the surface of the substrate 2 is etched. Because of the high-pressure process, the radicals and the ions are carried toward the substrate 2 by process gas flows FLd, FLd' injected mainly from the process gas introducing ports 31, 36. During the etching, the rare gas is introduced from the rare gas supply source 22 through the rare gas introducing ports 41 (arrow FLe). In this embodiment, helium (He) is used as the rare gas. It is noted, however, that the rare gas has only to contain at least one kind selected from among helium, argon (Ar), xenon (Xe) and neon (Ne). Helium is preferred because of its being smaller in molecular weight, requiring smaller energy for etching of the dielectric plate 8, than argon and the like.

Referring to FIGS. 1 to 4, the beam-shaped spacer 7 in this embodiment has an annular outer peripheral portion 7a, a central portion 7b located at the center of a region surrounded by the outer peripheral portion 7a in plane view, and a plurality (six in this embodiment) of beam portions 7c extending radially from the central portion 7b to the outer peripheral portion 7a.

Figure 5:
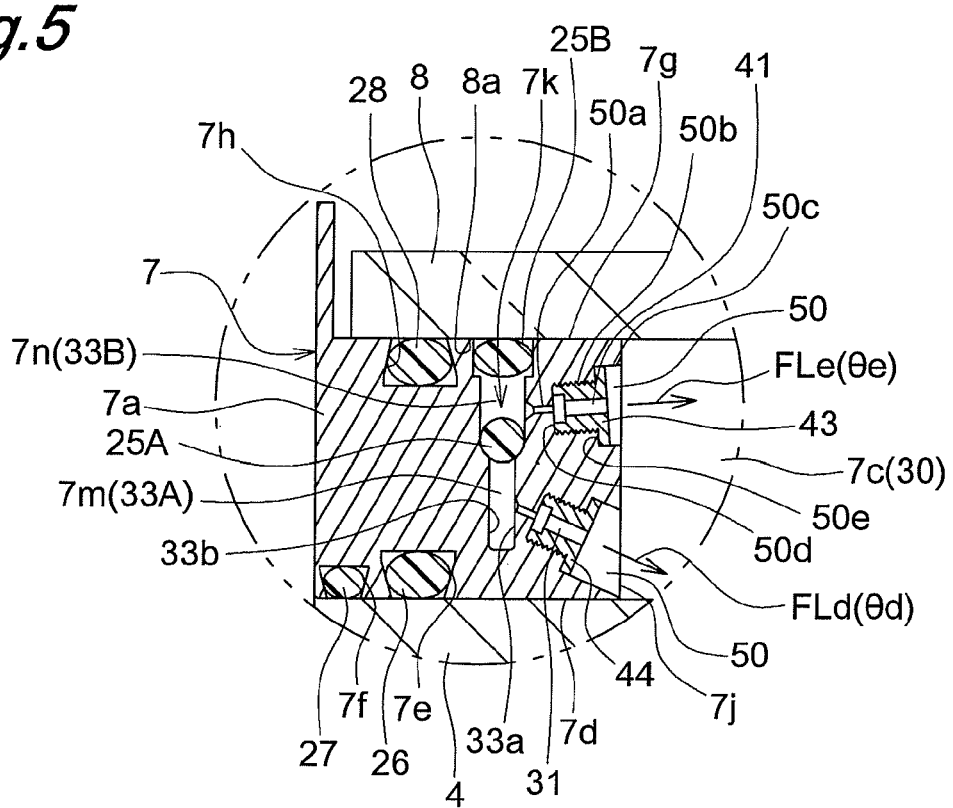
FIG. 5 is a partially enlarged sectional view showing an outer peripheral portion of the beam-shaped spacer.

Referring also to FIG. 5, a lower surface 7d of the outer peripheral portion 7a of the beam-shaped spacer 7 is supported on the upper end surface of the side wall of the chamber main body 4. Annular grooves 7e, 7f are formed on the lower surface 7d of the outer peripheral portion 7a, and the sealability of a junction between the beam-shaped spacer 7 and the chamber main body 4 is secured by O-rings 26, 27 received in the grooves 7e, 7f. Also, a lower surface 8a of the dielectric plate 8 is supported on an upper surface 7g of the outer peripheral portion 7a. An annular groove 7h is formed on the upper surface 7g of the outer peripheral portion 7a, and an O-ring 28 is received by the groove 7h. By the O-ring 28, sealability at the junction of the beam-shaped spacer 7 and the dielectric plate 8.

The six beam portions 7c of the beam-shaped spacer 7 have a rectangular parallelepiped shape of a generally constant width and extend radially from the central portion 7b at equiangular intervals in plane view (see FIGS. 2 and 3). One end of each beam portion 7c is integrally connected with the central portion 7b, and the other end is integrally connected with the outer peripheral portion 7a.

Three recess portions 7i are provided in the upper surface 7g at the central portion 7b of the beam-shaped spacer 7, and an elastic member 29 is received in each of the recess portions 7i. The elastic member 29 is interposed between the central portion 7b of the beam-shaped spacer 7 and the lower surface 8a of the dielectric plate 8.

Regions surrounded by the outer peripheral portion 7a, the central portion 7b and the beam portions 7c of the beam-shaped spacer 7 constitute window portions 30 from which the lower surface 8a of the dielectric plate 8 is exposed when viewed from the substrate susceptor 14 side. In this embodiment, the beam-shaped spacer 7 has six window portions 30, each of which has a sectoral shape.

As described above, the beam-shaped spacer 7 has the annular outer peripheral portion 7a, the central portion 7b located at the center of the region surrounded by the outer peripheral portion 7a, and the plurality of beam portions 7c extending radially from the central portion 7b to the outer peripheral portion 7a. Therefore, all portions of the lower surface 8a of the dielectric plate 8, i.e., the outer peripheral portion, the central portion, and the portion located between the outer peripheral portion and the central portion are supported by the beam-shaped spacer 7. In other words, the dielectric plate 8 is wholly uniformly supported by the beam-shaped spacer 7. When the chamber 3 is internally reduced in pressure, a differential pressure between the internal pressure (negative pressure) of the chamber and the atmospheric pressure acts on the dielectric plate 8. However, the dielectric plate 8 is wholly uniformly supported by the beam-shaped spacer 7 even under action of a load due to the differential pressure. On the other hand, particularly the central portion of the dielectric plate 8 easily sags downward (toward the substrate susceptor 14 side) by the load due to the differential pressure when the chamber 3 is internally reduced in pressure. The beam-shaped spacer 7 has the central portion 7b connected to the outer peripheral portion 7a with the beam portions 7c, and the central portion 7b supports the central portion of the dielectric plate 8 from the lower surface 8a side. Therefore, the sag of the central portion of the dielectric plate 8 can effectively be prevented or suppressed.

As described above, by uniformly supporting the lower surface 8a of the dielectric plate 8 by the beam-shaped spacer 7 and supporting the central portion of the dielectric plate 8 that easily sags by the central portion 7b of the beam-shaped spacer 7, the dielectric plate 8 can be reduced in thickness while the mechanical strength (also in consideration of deformation of the dielectric plate 8 when the chamber 3 is internally reduced in pressure) is secured to support the atmospheric pressure when the chamber 3 is internally reduced in pressure. For example, when a dielectric plate having a diameter of 320 mm is supported by a spacer that supports only the outer peripheral portion of the dielectric plate, the thickness of the dielectric plate needs to be set to 25 mm or more in order to secure the mechanical strength. In contrast to this, when the dielectric plate 8 having a diameter of 320 mm is supported by the beam-shaped spacer 7 of this embodiment, the required mechanical strength can be obtained when the dielectric plate 8 has a thickness of about 10 mm. Since the loss of the applied radio frequency power can be remarkably reduced by reducing the thickness of the dielectric plate 8, the plasma can be densified. Moreover, to obtain the same plasma density, the radio frequency power thrown into the ICP coil 9 can be reduced in comparison to cases of large thicknesses of the dielectric plate, so that the process characteristics such as etching rate and etching shape due to the heat generation of the dielectric plate 8 or the like can be prevented from changing with increasing number of substrates to be processed.

The beam portions 7c of the beam-shaped spacer 7 extend in the direction perpendicular to the portion in which the turn density of the conductors 11 constituting the ICP coil 9 is dense. Therefore, an electromagnetic influence that the beam-shaped spacer 7 exerts on the electromagnetic fields generated around the conductors 11 of the ICP coil 9 when the radio frequency power is applied from the radio frequency power source 13 can be suppressed. That is, the structure is such that circumferential eddy currents flowing within the beam-shaped spacer 7 are reduced. As a result, the loss of the applied radio frequency power can be further reduced. In order to obtain the effect of reducing the loss, the beam portions 7c and the portion in which the turn density of the conductors 11 is dense need not necessarily be accurately perpendicular to each other, and both of them only need to be substantially perpendicular to each other. For example, when the beam portions 7c and the conductors 11 intersect each other at an angle of about 90°±10° in plane view, the effect of reducing the loss is obtained. It is preferred that the number (six) of the beam portions 7c of the beam-shaped spacer 7 and the number (six) of the conductors 11 constituting the ICP coil 9 coincide with each other in addition to the arrangement that the conductors 11 are perpendicular to the beam portions 7c in plane view. With this arrangement, the symmetry of the electromagnetic fields generated when the radio frequency power is thrown into the ICP coil 9 from the radio frequency power source 13 is improved, allowing the symmetry of generated plasma distribution to be improved as well, so that the loss attributed to the presence of the beam portions 7c can be further reduced.

Next, the construction for introducing the process gas and the rare gas into the chamber 3 is described with reference to FIGS. 1, 2 and 4 to 8.

First, the construction for introducing the process gas into the chamber 3 is described.

The outer peripheral portion 7a of the beam-shaped spacer 7 faces the window portions 30, and has an inner side wall surface 7j opposed to the central portion 7b. On this inner side wall surface 7j are provided a plurality (18 in this embodiment) of process gas introducing ports 31. One set of three process gas introducing ports 31 is provided for each of the six window portions 30. Also, in a plane view as shown in FIG. 2, all the process gas introducing ports 31 are directed toward the center of the beam-shaped spacer 7, i.e. the center of the substrate 2, and the eighteen gas introducing ports are placed symmetrical with respect to the center of the beam-shaped spacer 7, therefore to the center of the substrate 2.

As shown in FIGS. 1 and 5, in a vertical plane, the process gas introducing ports 31 are directed diagonally downward. In more detail, an angle (depression angle θd) that the process gas introducing ports 31 form against the horizontal direction within the vertical plane is so set that the injected process gas is directed toward the substrate 2 as shown by arrow FLd. The depression angle θd is set within a range of, for example, 20°-40°, more preferably 25°-35° or so, depending on the size of the substrate 2, the distance from the substrate 2 to the process gas introducing ports 31, and the like. In this embodiment, all the process gas introducing ports 31 provided in the beam-shaped spacer 7 are of the equal depression angle θd. However, the process gas introducing ports may differ in depression angle thereamong as will be detailed for seventh to ninth embodiments.

As will be detailed later, a plurality (18 in this embodiment) of process gas introducing port chips 44 (see FIG. 6) are removably or replaceably mounted on the inner side wall surface 7j of the outer peripheral portion 7a of the beam-shaped spacer 7, where the process gas introducing ports 31 are provided in the individual process gas introducing port chips 44, respectively. In FIG. 1, although the dry etching apparatus 1 are shown, the process gas introducing port chips 44 are not shown for simplicity's sake.

Referring to FIG. 5, an annular gas passage groove 7k is formed inwardly of the O-ring 28 at the upper surface 7g of the outer peripheral portion 7a of the beam-shaped spacer 7. The gas passage groove 7k has an upper opening closed with the lower surface 8a of the dielectric plate 8. The gas passage groove 7k has a lower-side portion 7m of a narrow groove width on the lower surface 7d side of the beam-shaped spacer 7 and, on the other hand, an upper-side portion 7n larger in groove width than the lower-side portion 7m provided on the upper surface 7g side. The lower-side portion 7m and the upper-side portion 7n are cut off from each other by an O-ring 25A. Also, an O-ring 25B is for sealing the upper-side portion 7n is provided. Therefore, the lower-side portion 7m and the upper-side portion 7n of the gas passage groove 7k constitute annular gas passages 33A, 33B that are sealed and cut off from each other. Each of the process gas introducing ports 31 communicates with the inner peripheral wall 33a side of the lower-side annular gas passage 33A. Also, an introducing passage 34A whose one end communicates with the outer peripheral wall 33b side of the annular gas passage 33A and the other end is connected to the process gas supply source 21 is provided (see FIGS. 1 and 2 in combination). Therefore, the process gas supplied from the process gas supply source 21 is injected from the process gas introducing ports 31 into the chamber 3 through the introducing passage 34A and the annular gas passage 33A.

Figure 7:
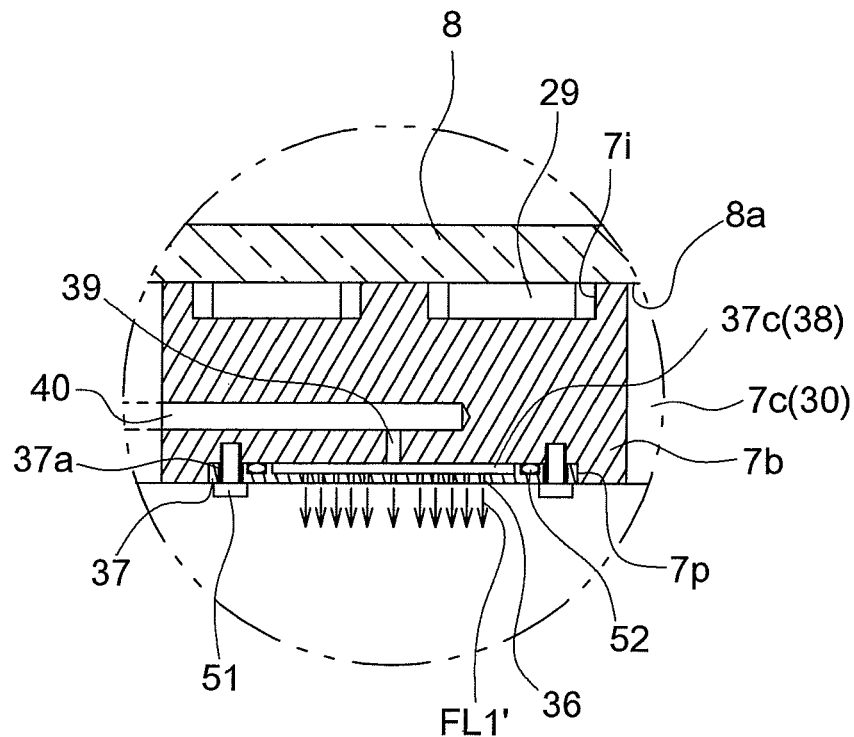
FIG. 7 is a partially enlarged sectional view showing a central portion of the beam-shaped spacer.
Figure 8:
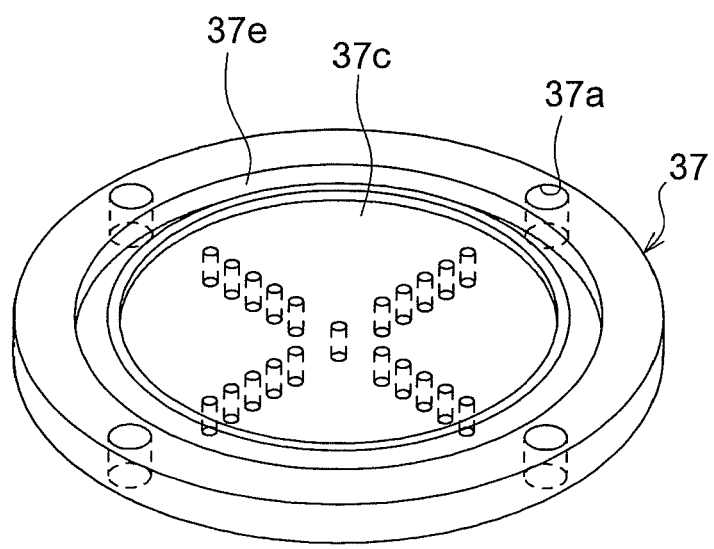
FIG. 8 is a perspective view showing an introducing port plate.

Referring to FIGS. 1, 7 and 8, a receiving recess portion 7p is formed at the central portion 7b of the beam-shaped spacer 7, and a replaceable introducing port plate 37, at which a process gas introducing port 36 is formed, is received in the receiving recess portion 7p. An inlet gas passage 39 whose one end communicates with each process gas introducing port 36 via a gas distribution chamber 38 is formed at the central portion 7b of the beam-shaped spacer 7. As shown in FIG. 1, a gas passage 40 has one end communicating with the lower-side annular gas passage 33A and the other end extending through the inside of one of the six beam portions 7c and reaching the central portion 7b. As shown in FIG. 7, the other end of the gas passage 40 and the inlet gas passage 39 communicate with each other. Therefore, the process gas supplied from the process gas supply source 21 passes through the annular gas passage 33A, the introducing passage 34A, the annular gas passage 33A, the gas passage 40, the inlet gas passage 39, inlet gas passage 39, and the gas distribution chamber 38, thus being injected from the process gas introducing port 36 into the chamber 3 as shown by arrow FLd'. The process gas introducing port 36 is oriented generally vertical within the vertical plane. However, the process gas introducing port 36 may also be oriented so as to be radially widened.

Next, the construction for introducing the rare gas into the chamber 3 is described.

A plurality (18 in this embodiment) of rare gas introducing ports 41 are provided in the inner side wall surface 7j of the outer peripheral portion 7a of the beam-shaped spacer 7. One set of three rare gas introducing ports 41 is provided for each of the six window portions 30. Also, in a plane view as shown in FIG. 2, all the rare gas introducing ports 41 are directed toward the center of the beam-shaped spacer 7, i.e. the center of the dielectric plate 8, and the eighteen gas introducing ports are placed symmetrical with respect to the center of the beam-shaped spacer 7, therefore to the center of the dielectric plate 8.

As shown in FIGS. 1 and 5, in a vertical plane, the rare gas introducing ports 41 are directed diagonally upward. In more detail, an angle (elevation angle θe) that the rare gas introducing ports 41 form against the horizontal direction within the vertical plane is so set that the injected rare gas is directed toward the dielectric plate 8 as shown by arrow FLe. The elevation angle θe is set within a range of, for example, 5°-30°, more preferably 10°-25° or so, depending on the size of the dielectric plate 8, the distance from the substrate 2 to the gas introducing ports 41, and the like, so that the rare gas is injected to the dielectric plate 8 in a neighborhood of a later-described high-density plasma generation region 42.

As will be detailed later, a plurality (18 in this embodiment) of rare gas introducing port chips 43 (see FIG. 6) are removably or replaceably mounted on the inner side wall surface 7j of the outer peripheral portion 7a of the beam-shaped spacer 7, where the rare gas introducing ports 41 are provided in the individual rare gas introducing port chips 43, respectively. In FIG. 1, although the rare gas introducing ports 41 are shown, the rare gas introducing port chips 43 are not shown for simplicity's sake.

Referring to FIG. 5, each of the rare gas introducing ports 41 communicates with the inner peripheral wall 33a side of the upper-side annular gas passage 33B. Also, an introducing passage 34D whose one end communicates with the outer peripheral wall 33b side of the annular gas passage 33B and the other end is connected to the rare gas supply source 22 is provided (see also FIG. 2). The introducing passage 34D is cut off from the process-gas side introducing passage 34A. The rare gas supplied from the rare gas supply source 22 is injected from the rare gas introducing ports 41 into the chamber 3 through the introducing passage 34D and the annular gas passage 33B.

Next, below described are reasons that improvement of etching rate of the substrate 2 as well as effective suppression of etching or wear of the dielectric plate 8 can be achieved by the dry etching apparatus 1 of this embodiment in the high-pressure, high-power, ultrahigh-density plasma generation process.

As described above, the conductors 11 constituting the ICP coil 9 are placed dense to each other in the region corresponding to the outer periphery of the dielectric plate 8. Therefore, a toroidal- or doughnut-shaped high-density plasma is generated in the region corresponding to the outer periphery of the ICP coil 9 in a neighborhood of the lower surface of the dielectric plate 8, i.e., in regions of the individual window portions 30 closer to the outer peripheral portion 7a of the beam-shaped spacer 7 in plane view. FIGS. 1 and 2 schematically show the regions 42 where the high-density plasma is generated. In addition to the process gas introducing port 36 at the central portion 7b of the outer peripheral portion 7a, process gas introducing ports 31 are provided also in the inner side wall surface 7j facing the window portions 30 of the outer peripheral portion 7a of the beam-shaped spacer 7. The process gas is injected into the chamber 3 from the process gas introducing ports 31 located in close proximity to the region 42 where the high-density plasma is present. As a result, plasma formation from the process gas is effectively accelerated. Also, since the dielectric plate 8 is supported by the beam-shaped spacer 7 that includes the annular outer peripheral portion 7a, the central portion 7b located at the center of the region surrounded by the outer peripheral portion 7a, and a plurality of beam portions 7c extending radially from the central portion to the outer peripheral portion, the dielectric plate 8 can be reduced in thickness while the mechanical strength is secured in consideration of deformation of the dielectric plate 8 involved in pressure reduction of the interior of the chamber 3. As a result, the loss of applied radio frequency power can be largely reduced so that the plasma can be further densified. These two reasons, that is, high efficiency of dissociation of the process gas and extremely low loss of applied radio frequency power make it possible to realize high etching rate.

As described before, high-density plasma is generated in the region 42 corresponding to the outer peripheral side of the ICP coil 9 in a neighborhood of the lower surface of the dielectric plate 8. In a case where the process gas (etching gas)

is $SF_6/O_2/He$ gas as in this embodiment, F radicals are present at high density in the high-density plasma generation region 42, and $SF_x$ ions are also present in correspondence to the F radicals. Adsorption of these F radicals and sputtering of $SF_x$ ions cause the lower surface 8a of the dielectric plate 8 to be considerably etched or worn. However, in this embodiment, the rare gas is injected toward the lower surface 8a of the dielectric plate 8 in the neighborhood of the high-density plasma generation region 42 from the rare gas introducing ports 41 provided in the inner side wall surface 7j confronting the window portions 30 of the outer peripheral portion 7a of the beam-shaped spacer 7. Therefore, the partial pressure of the rare gas in the window portions 30 immediately under the dielectric plate 8 becomes relatively higher, compared with the other regions within the chamber 3. That is, the rare gas in the window portions 30 immediately under the dielectric plate 8 becomes higher in gas density. Since the rare gas is extremely low in reactivity, etching or wear of the lower surface 8a of the dielectric plate 8 is effectively suppressed or prevented. In particular, the rare gas introducing ports 41 are located in the inner side peripheral wall 7j of the outer peripheral portion 7a of the beam-shaped spacer 7, and so the etching or wear of the lower surface of the dielectric plate 8 can effectively be suppressed also because the rare gas is injected from positions close to the high-density plasma generation region 42.

Figure 9:
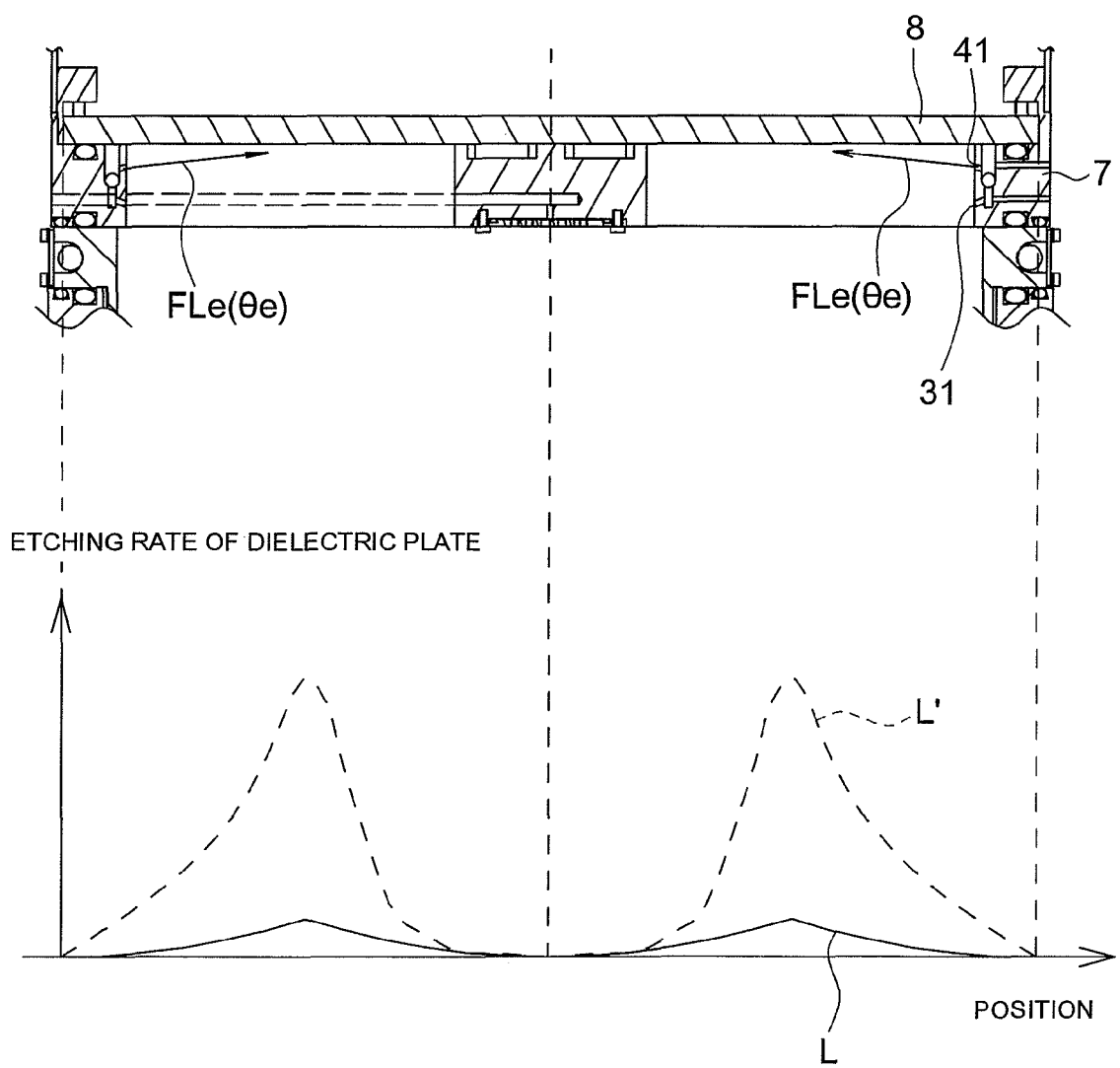
FIG. 9 is a schematic view showing an etching rate distribution of a dielectric plate.

Referring to FIG. 9, broken line L' and solid lie L show etching rate (wear) distributions of the dielectric plate 8. The broken line L' shows a case in which the process gas was injected only from the process gas introducing ports 31 without injection of the rare gas from the rare gas introducing ports 41. On the other hand, the solid lie L shows a case in which the process gas was injected from the process gas introducing ports 31 and moreover the rare gas was injected from the rare gas introducing ports 41. As shown by the broken line L', without injection of the rare gas from the rare gas introducing ports 41, it is shown that the lower surface 8a of the dielectric plate 8 was largely cut by F radicals or $SF_x$ ions in vicinities of the high-density plasma generation region 42 (see FIGS. 1 and 2). On the other hand, as shown by the solid lie L, the cuts of the lower surface of the dielectric plate 8 in the neighborhood of the high-density plasma generation region 42 can be sharply decreased by injecting the rare gas from the rare gas introducing ports 41, so that the etching or wear of the dielectric plate 8 can effectively be reduced.

Next, the process gas introducing port chips 44, the introducing port plate 37, the rare gas introducing port chips 43 and their peripheral structure are described in detail.

Since the process gas introducing port chips 44 and the rare gas introducing port chips 43 are of the same structure, the rare gas introducing port chips 43 are explained with reference to FIGS. 5 and 6.

Referring to FIG. 5, in the outer peripheral portion 7a of the beam-shaped spacer 7, a plurality of fitting holes 50 oriented diagonally downward and each having a circular cross section are provided so as to extend from the inner peripheral wall 33a of the annular gas passage 33B up to the inner side wall surface 7j. The rare gas introducing port chips 43 are removably or replaceably mounted at the fitting holes 50, respectively. Each of the fitting holes 50 has, in this order from the annular gas passage 33B side, which is the upper side, an inlet portion 50a communicating with the annular gas passage 33B, a female screw portion 50b, and an outlet portion 50c opened into the chamber 3. The female screw portion 50b is larger in diameter than the inlet portion 50a, and a seat portion 50d is formed by a step gap between connecting portions of the female screw portion 50b and the inlet portion 50a. Also, the outlet portion 50c is larger in diameter than the female screw portion 50b, and a seat portion 50e is formed by a step gap between connecting portions of the outlet portion 50c and the female screw portion 50b.

Figure 6:
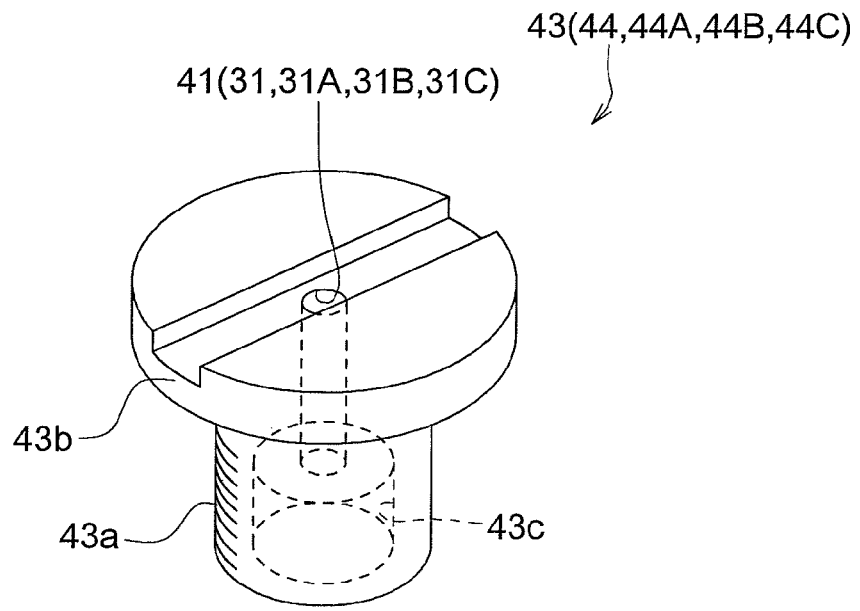
FIG. 6 is a perspective view showing an introducing port chip.

Referring also to FIG. 6 in combination, each of the rare gas introducing port chips 43 has a male screw portion 43a, and a head portion 43b integrally formed with a forward end of the male screw portion 43a. The head portion 43b is larger in diameter than the male screw portion 43a. A recess portion 43c is formed in a base end surface of the male screw portion 43a. The rare gas introducing port is provided so as to extend through from a bottom wall of the recess portion 43c to a forward end surface of the head portion 43b. The rare gas introducing port 41 extends along a center axis of the rare gas introducing port chip 43. The male screw portion 43a of the rare gas introducing port chip 43 is screwed into the female screw portion 50b of the fitting hole 50, so that the rare gas introducing port chip 43 is fixed to the outer peripheral portion 7a of the beam-shaped spacer 7. The head portion 43b of the rare gas introducing port chip 43 is received by the outlet portion 50c of the fitting hole 50. Also, the base end surface of the male screw portion 43a is placed on the seat portion 50d, and the base end surface of the head portion 43b is placed on the seat portion 50e.

From the annular gas passage 33B to the interior of the chamber 3, a path is formed by the inlet portion 50a of the fitting hole 50, the recess portion 43c of the rare gas introducing port chip 43, and the rare gas introducing port 41. Through this path, the process gas is injected from the rare gas introducing port 41 into the chamber 3.

In this embodiment, the rare gas introducing ports 41 are provided along the center axis line of the rare gas introducing port chips 43, and the elevation angle θe of each rare gas introducing port 41 is set by an angle of the fitting hole 50 within the vertical plane. Also in this embodiment, the process gas introducing ports 31 are provided along the center axis line of the process gas introducing port chips 44, and the depression angle θd of each rare gas introducing port 41 is set by differentiating the angle of the fitting holes 50 within the vertical plane.

With preparations of a plurality of types of rare gas introducing port chips 43 having different opening areas of the rare gas introducing ports 41 or different elevation angles θe of the rare gas introducing ports 41, replacing the rare gas introducing port chips 43 allows the rare gas introducing ports 41 to be changed in their opening areas or orientations. Under a condition of the same supply pressure of the rare gas supply source 22, generally, the flow rate of the introduced rare gas increases with increasing opening area of the rare gas introducing ports 41, and the flow rate of the rare gas decreases with decreasing opening area. Replacing the rare gas introducing port chips 43 with others having different rare gas introducing ports 41 depending on process conditions, the size of the substrate 2 or other conditions makes it possible to supply the rare gas securely to the dielectric plate 8 in the neighborhood of the high-density plasma generation region 42 even with process changes or the like, so that etching or wear of the substrate 2 can effectively be prevented.

Similarly, replacing the process gas introducing port chips 44 with others having process gas introducing ports 31 of different opening areas or orientations depending on process conditions, the size of the substrate 2 or other conditions makes it possible to finely adjust the supply quantity or directions of the process gas and, as a result, securely obtain high etching rates, even with process changes or the like.

Next, the introducing port plate 37 are described with reference to FIGS. 7 and 8.

Referring to FIGS. 7 and 8, the introducing port plate 37 has through holes (four in number in this embodiment) 37a that extend through in the thicknesswise direction near the outer peripheral edge. Screws 51 passed into the through holes 37a are screwed into screw holes formed in the bottom wall of the receiving recess portion 7p, by which the introducing port plate 37 is fixed into the receiving recess portion 7p. Also, a recess portion 37c is formed at a central portion of the upper surface 37b of the introducing port plate 37. This recess portion 37c and the bottom wall of the receiving recess portion 7p define the gas distribution chamber 38 communicating with the inlet gas passage 39. The process gas introducing port 36 extends through vertically from the bottom wall of the recess portion 37c so as to reach the lower surface 37d of the introducing port plate 37.

In the upper surface 37b of the introducing port plate 37, an annular groove 37e is formed so as to surround the recess portion 37c, and sealability of the interior of the gas distribution chamber 38 is ensured by an O-ring 52 received by the annular groove 37e. Passing through the introducing passage 34A, the annular gas passage 33A, the gas passage 40, the inlet gas passage 39, and the gas distribution chamber 38, the process gas supplied from the process gas supply source 21 is injected downward into the chamber 3 so as to be directed toward the substrate 2 from the process gas introducing port 36 of the introducing port plate 37.

As in the case of the rare gas introducing port chips 43 or the process gas introducing port chips 44 described above, preparing introducing port plate 37 having different opening areas, orientations, counts, placements or the like of the process gas introducing port 36 makes it possible to change or adjust the quantity of the process gas supplied to the substrate 2 or the supply amount of the process gas by replacement of the introducing port plate 37.

Second Embodiment

In a dry etching apparatus 1 of the ICP type according to a second embodiment of the invention shown in FIGS. 10 to 13, the process gas is injected only from process gas introducing ports 31 provided in the outer peripheral portion 7a of the beam-shaped spacer 7, while the rare gas is injected only from rare gas introducing ports 61, 62 provided in the central portion 7b of the beam-shaped spacer 7.

Figure 10:
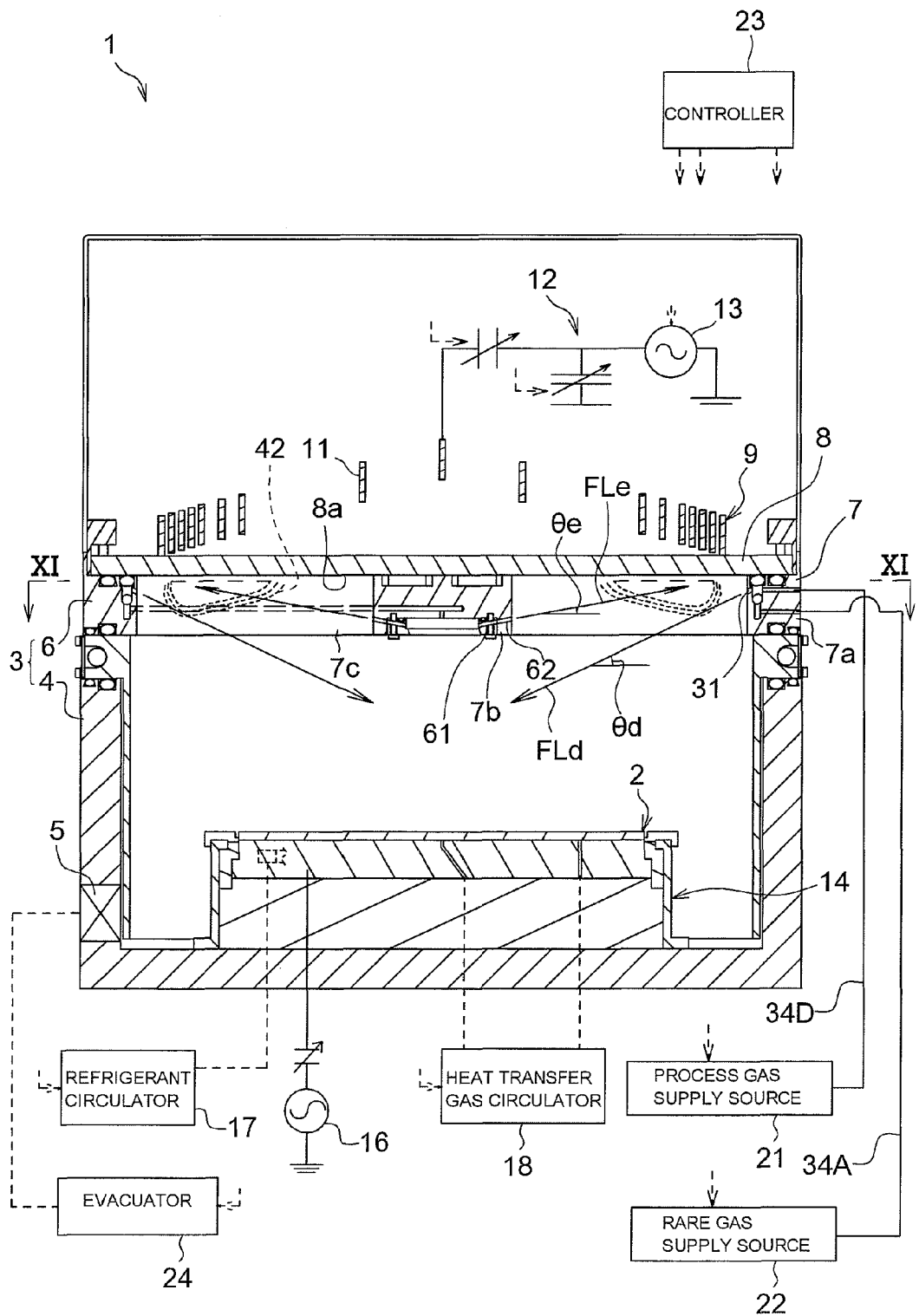
FIG. 10 is a schematic sectional view of a dry etching apparatus according to a second embodiment of the invention.
Figure 11:
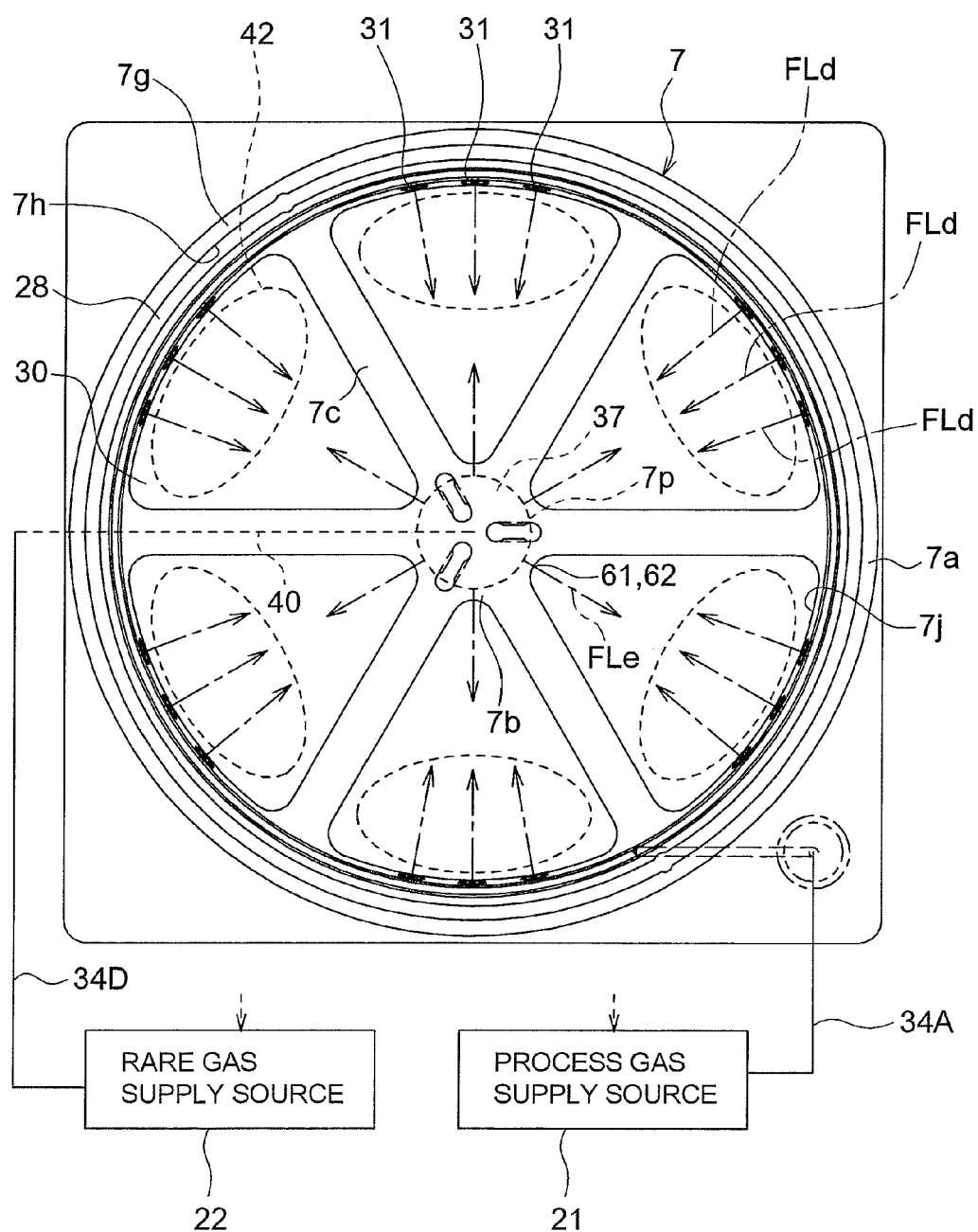
FIG. 11 is a sectional view taken along the line XI-XI of FIG. 10.
Figure 12:
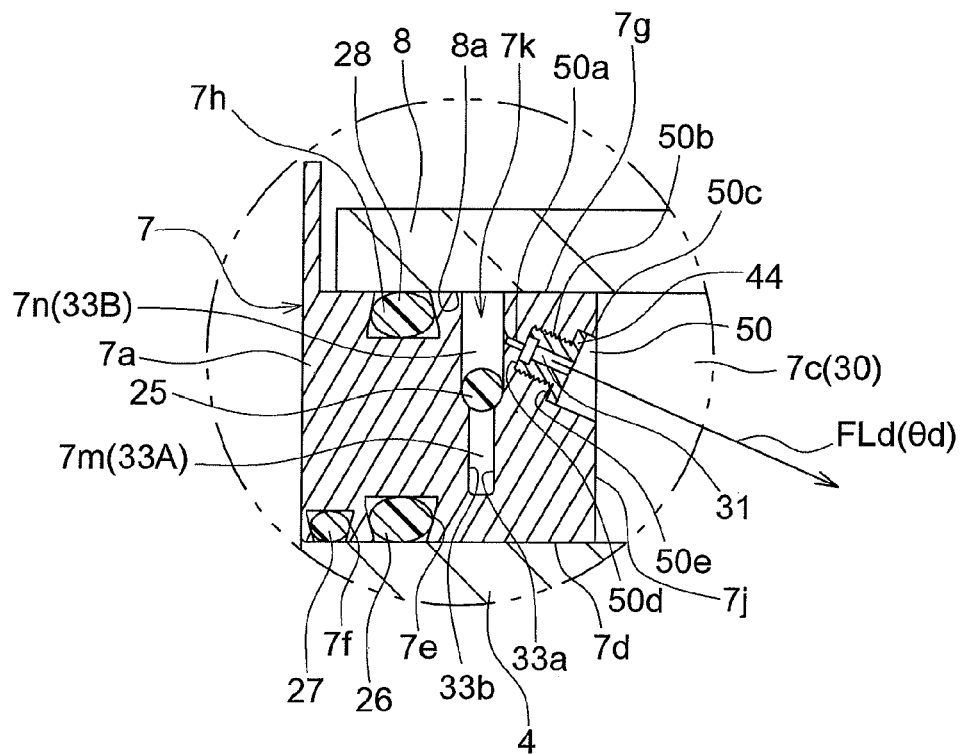
FIG. 12 is a partially enlarged sectional view showing an outer peripheral portion of a beam-shaped spacer.

Referring to FIGS. 10, 11 and 12, the process gas introducing port chips 44 having the process gas introducing ports 31 are mounted at fitting holes 50 communicating with the upper annular gas passage 33B out of the two-stage annular gas passages 33A, 33B of the outer peripheral portion 7a of the beam-shaped spacer 7. Also, the introducing passage 34A on the process gas supply source 21 side is connected to the upper annular gas passage 33B. Accordingly, the process gas is injected from the process gas introducing ports 31 after passing from the process gas supply source 21 through the introducing passage 34A and the upper annular gas passage 33B.

Figure 13:
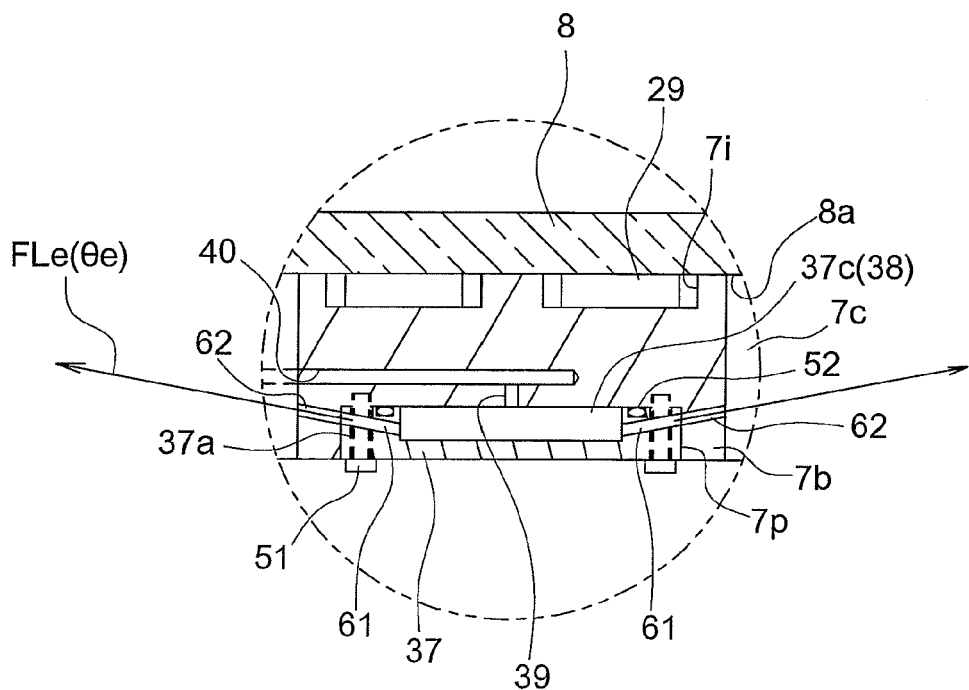
FIG. 13 is a schematic view showing a central portion of the beam-shaped spacer.

Referring to FIGS. 10, 11 and 13, the introducing port plate 37 in this embodiment, without having the rare gas introducing ports 41, has a plurality of rare gas introducing ports 61 extending diagonally upward from the recess portion 37c (gas distribution chamber 38) to the outer peripheral side surface. A diagonally upward rare gas introducing ports 62 communicating with the rare gas introducing ports 61 are provided at the central portion 7b of the beam-shaped spacer 7. Also, the gas passage 40 is connected to the lower annular gas passage 33A out of the two-stage annular gas passages 33A, 33B of the outer peripheral portion 7a of the beam-shaped spacer 7.

Further, the introducing passage 34D on the rare gas supply source 22 side is connected to the lower annular gas passage 33A. Accordingly, the rare gas is injected toward the dielectric plate 8 from the rare gas introducing ports 61 after passing from the rare gas supply source 22 through the introducing passage 34A, the annular gas passage 33A, the gas passage 40, the inlet gas passage 39, and the gas distribution chamber 38.

The rest of construction and function of the second embodiment are similar to those of the first embodiment. Therefore, like component members are designated by like reference signs and their description is omitted.

Third Embodiment

Figure 14:
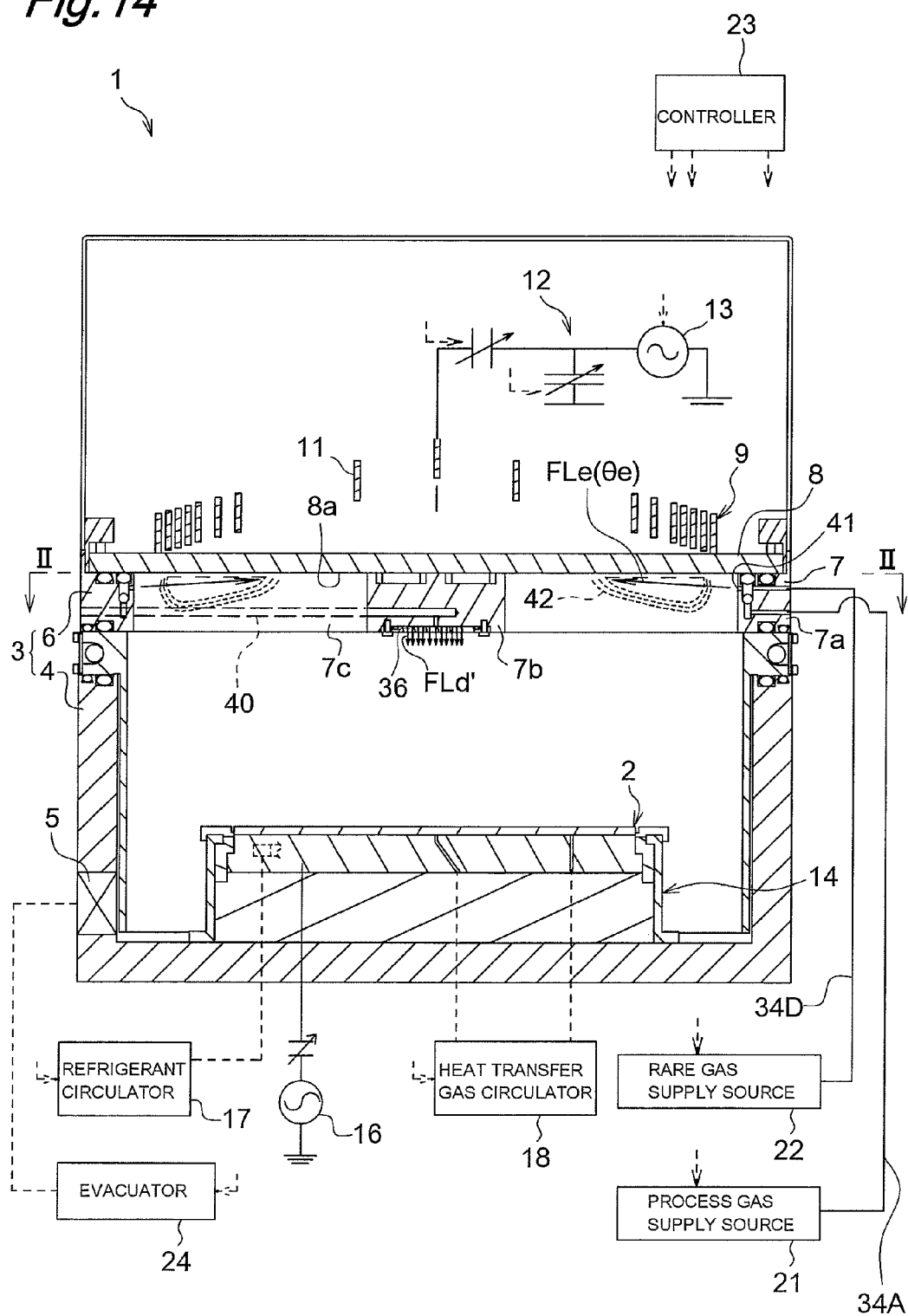
FIG. 14 is a schematic sectional view of a dry etching apparatus according to a third embodiment of the invention.

In a dry etching apparatus 1 according to a third embodiment of the invention shown in FIG. 14, the process gas is injected only from the process gas introducing ports 36 provided in the central portion 7b of the beam-shaped spacer, while the rare gas is injected only from the rare gas introducing ports 41 provided in the outer peripheral portion 7a of the beam-shaped spacer 7.

The rest of construction and function of the third embodiment are similar to those of the first embodiment. Therefore, like component members are designated by like reference signs and their description is omitted.

Fourth Embodiment

Figure 15:
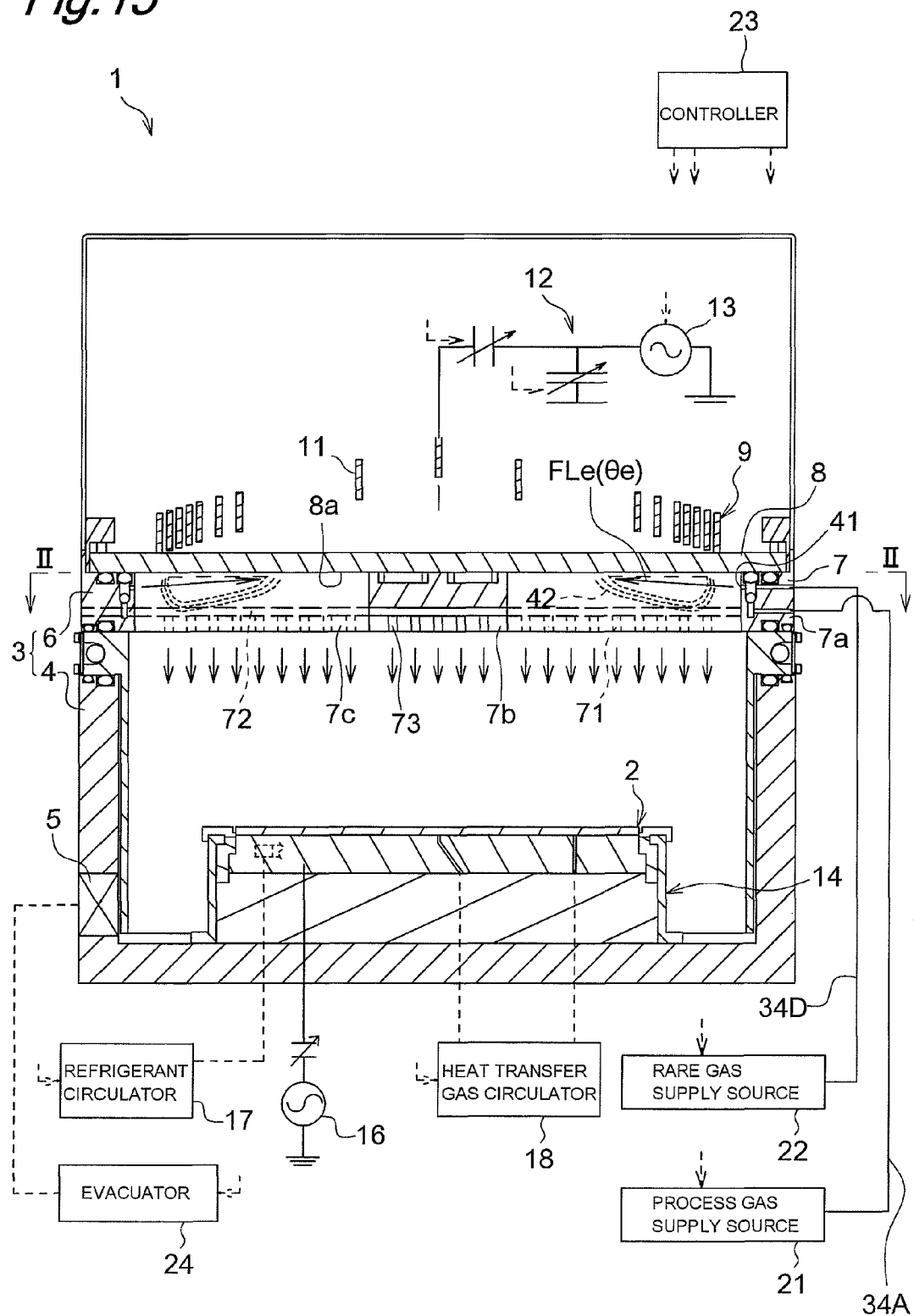
FIG. 15 is a schematic sectional view of a dry etching apparatus according to a fourth embodiment of the invention.
Figure 16:
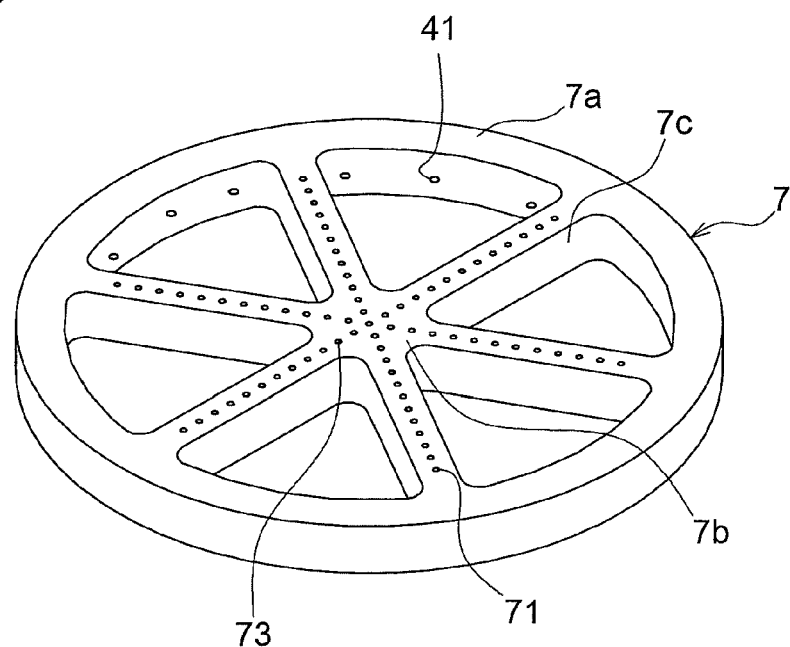
FIG. 16 is a perspective view of a beam-shaped spacer included in the dry etching apparatus of FIG. 15 as viewed from a lower surface side.

In a dry etching apparatus 1 according to a fourth embodiment of the invention shown in FIGS. 15 and 16, process gas introducing ports 71, 73 are provided in the outer peripheral portion 7a and the beam portions 7c of the beam-shaped spacer 7.

In the beam-shaped spacer 7, a gas passage 72 is formed so as to extend linearly from an outer-peripheral-side end portion of one beam portion 7c through the central portion 7b up to an outer-peripheral-side end portion of another opposing beam portion 7c. A plurality of gas introducing ports 71 oriented downward in the vertical direction are provided in the lower surface side of each beam portion 7c. Also on the lower surface side of the central portion 7b of the beam-shaped spacer 7 are provided a plurality of process gas introducing ports 73 oriented downward in the vertical direction. The base end (upper end) side of these gas introducing ports 71, 73 communicate with the gas passage 72, and their forward end (lower end) side is opened inward of the chamber 3.

The rest of construction and function of the fourth embodiment are similar to those of the first embodiment. Therefore, like component members are designated by like reference signs and their description is omitted.

Fifth Embodiment

Figure 17:
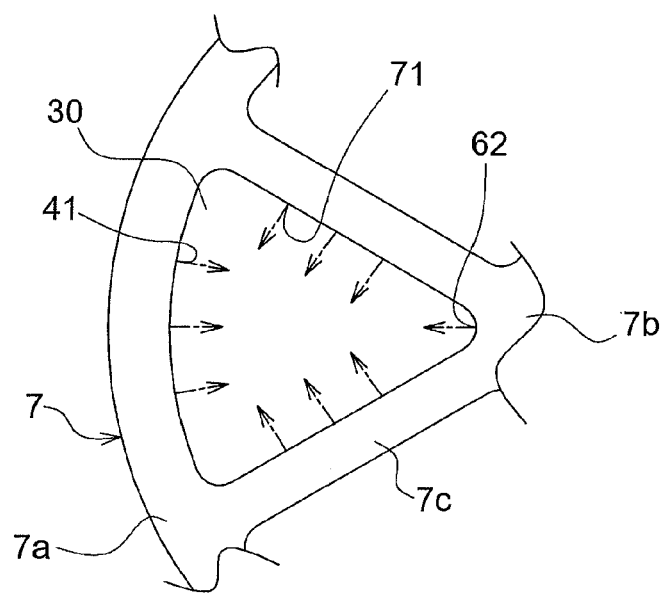
FIG. 17 is a schematic partial plan view of the beam-shaped spacer according to the fourth embodiment of the invention.

As shown in FIG. 17, rare gas introducing ports 41, 62, 71 may be provided in the outer peripheral portion 7a, the central portion 7b and the beam portions 7c of the beam-shaped spacer 7 so as to face the center of the window portion 30 in plane view. These rare gas introducing ports 41, 62, 71 each have an elevation angle θe oriented toward the lower surface of the dielectric plate 8 (see, e.g., FIG. 1), as in the first to fourth embodiments.

Sixth Embodiment

Figure 18:
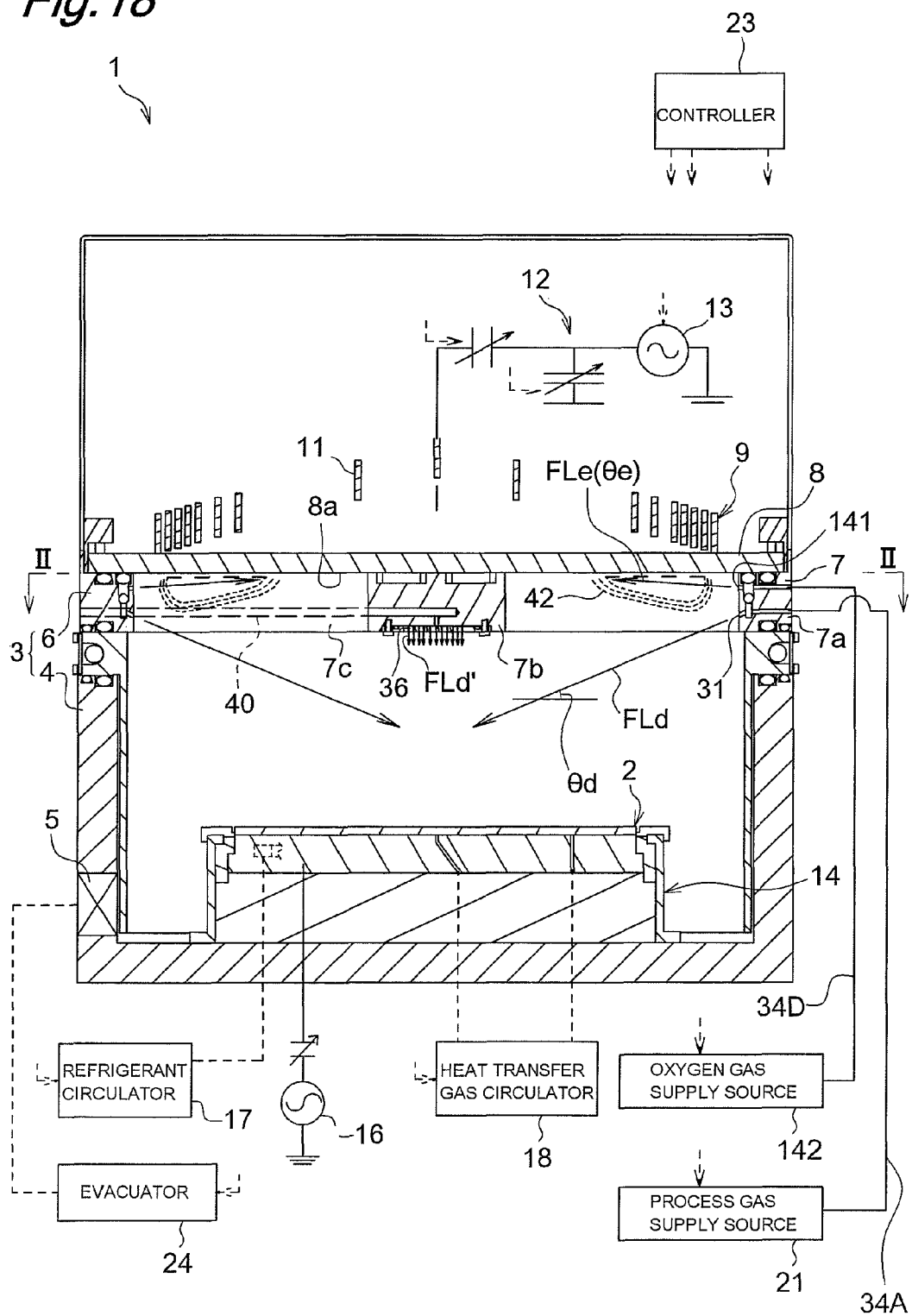
FIG. 18 is a schematic sectional view of a dry etching apparatus according to a fifth embodiment of the invention.

In a dry etching apparatus 1 according to a sixth embodiment of the invention shown in FIG. 18, instead of the rare gas supply source 22 (see FIG. 1) in the first embodiment, an oxygen gas ($O_2$ gas) supply source 142 is provided so that from this oxygen gas supply source 142, oxygen gas is injected so as to be directed from oxygen gas introducing ports (antiwear gas introducing ports) 141, which are identical in structure to the rare gas introducing ports 41 of the first embodiment, toward the lower surface 8a of the dielectric plate 8 near the high-density plasma generation region 42. Therefore, the partial pressure of the oxygen gas in the window portions 30 immediately under the dielectric plate 8 becomes relatively higher, compared with the other regions within the chamber 3. That is, the oxygen gas in the window portions 30 immediately under the dielectric plate 8 becomes higher in gas density, so that etching or wear of the lower surface 8a of the dielectric plate 8 is effectively suppressed or prevented.

In a case where the dielectric plate 8 is made of quartz ($SiO_2$), the dielectric plate 8 cannot be cut even with $O_2$ plasma applied thereto. Also, since oxygen gas can be used as the etching gas for the substrate 2, wear of the dielectric plate 8 can be reduced by injecting oxygen gas within a permissible range for the etching of the substrate 2.

The rest of construction and function of the sixth embodiment are similar to those of the first embodiment. Therefore, like component members are designated by like reference signs and their description is omitted. In the second to fifth embodiments, the oxygen gas introducing ports and the oxygen gas supply source may also be adopted, as in this embodiment, instead of the rare gas introducing ports and the rare gas supply source.

Seventh Embodiment

Figure 19:
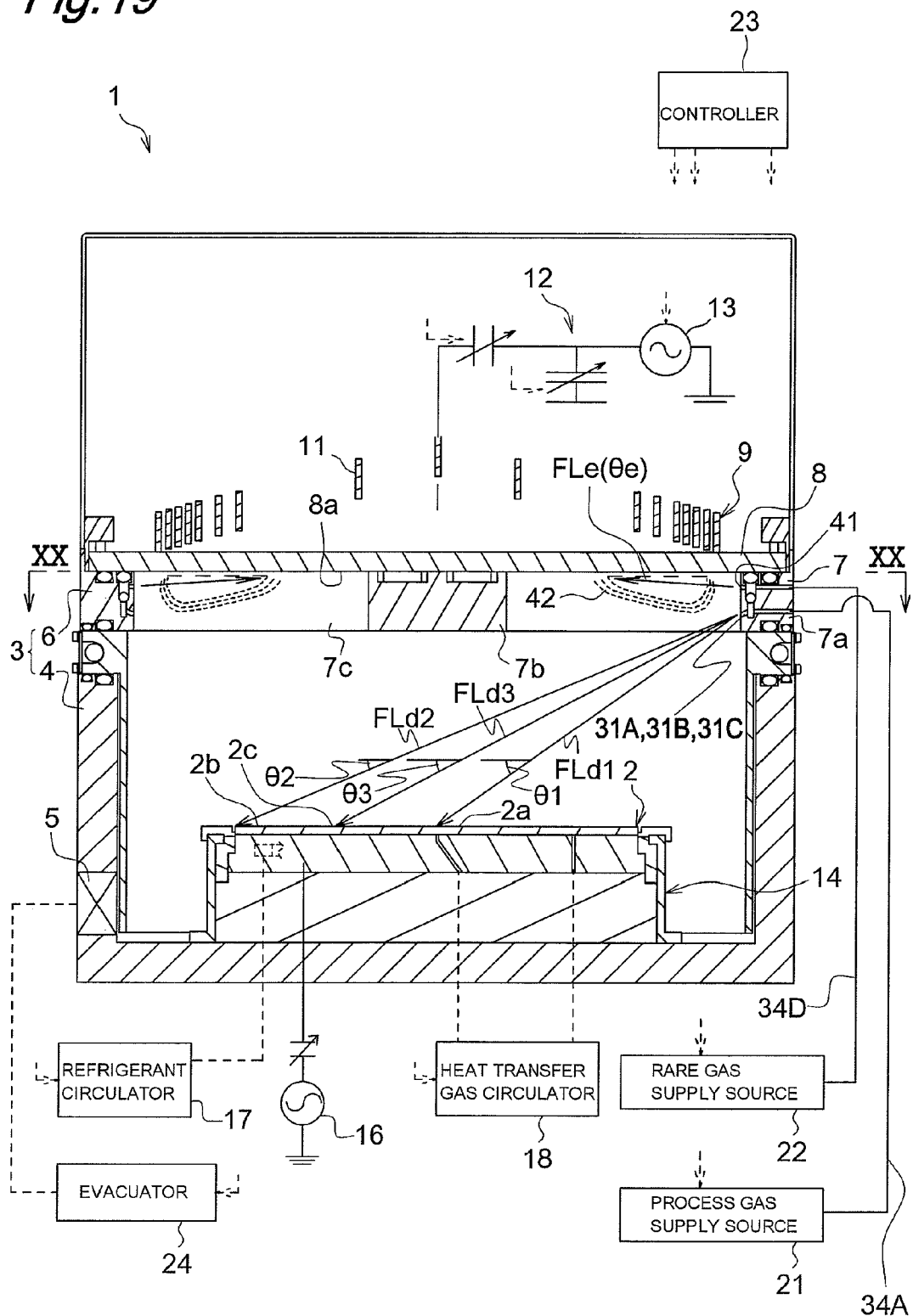
FIG. 19 is a schematic sectional view of a dry etching apparatus according to a seventh embodiment of the invention.
Figure 23A:
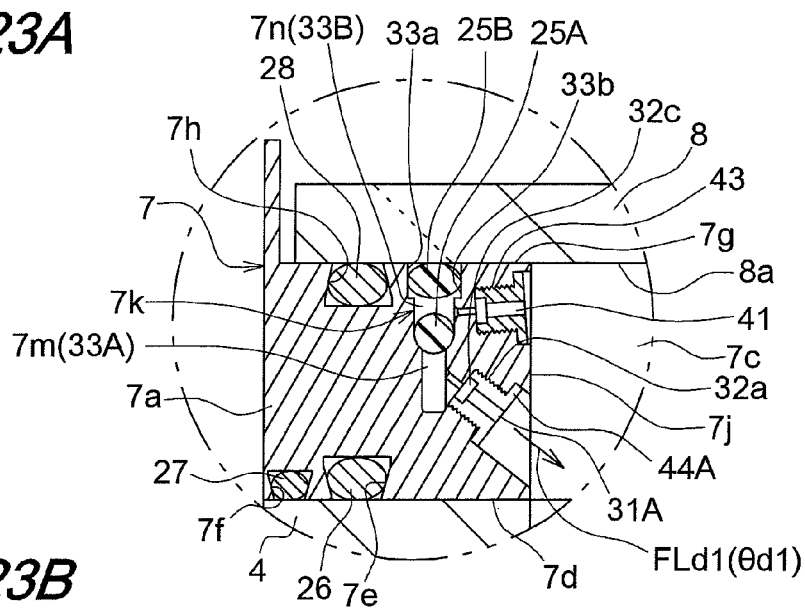
FIG. 23A is a partially enlarged sectional view showing a process gas introducing port chip and a rare gas introducing port chip.
Figure 23B:
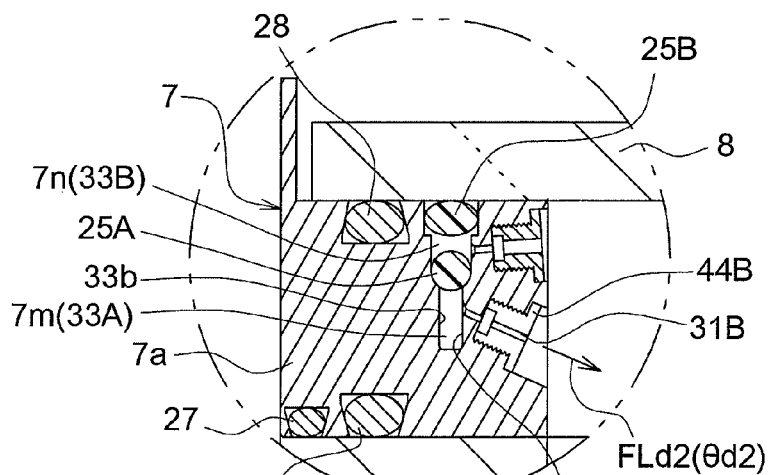
FIG. 23B is a partially enlarged sectional view showing a process gas introducing port chip and a rare gas introducing port chip.
Figure 23C:
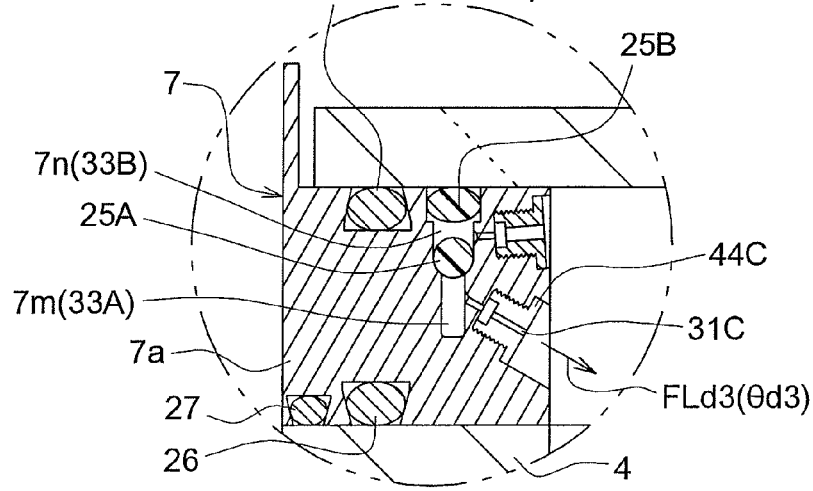
FIG. 23C is a partially enlarged sectional view showing a process gas introducing port chip and a rare gas introducing port chip.

FIGS. 19 and 23C show a dry etching apparatus 1 of the ICP type according to a seventh embodiment of the invention. The dry etching apparatus 1 of this embodiment is similar to that of the first embodiment (FIGS. 1 and 8), but differs therefrom in that the process gas introducing ports 31A-31C are different from one another, and that the process gas introducing ports 36 of the central portion 7b of the beam-shaped spacer 7 are not provided. The rest of construction of this embodiment, including the rare gas introducing ports 41 provided in the outer peripheral portion 7a of the beam-shaped spacer 7, are similar to that of the first embodiment. In FIGS. 19 and 23C, like component members in conjunction with the first embodiment are designated by like reference signs.

Next, the construction for introducing the process gas into the chamber 3 in this embodiment is described in detail with reference to FIGS. 19, 20 and 22 and FIGS. 23A to 23C.

A plurality (18 in this embodiment) of process gas introducing ports 31A, 31B, 31C are provided in the inner side wall surface 7j of the outer peripheral portion 7a of the beam-shaped spacer 7 so as to face the window portions 30. In the plane view shown in FIG. 20, all the process gas introducing ports 31A-31C are oriented toward the center of the beam-shaped spacer 7, i.e., toward the center of the substrate 2. As shown in FIG. 19 and FIGS. 23A to 23C, any of the process gas introducing ports 31A-31C is oriented diagonally downward in the vertical plane. Also, the process gas introducing ports 31A-31C are different thereamong in their angles (depression angle $\theta d1$, $\theta d2$, $\theta d3$) formed against the horizontal direction within the vertical plane. In other words, the process gas introducing ports 31A-31C have three types of depression angles $\theta d1$-$\theta d3$. In the vertical plane, the process gas is injected from the process gas introducing ports 31A-31C in directions that depend on the depression angles $\theta d1$-$\theta d3$. The depression angles $\theta d1$-$\theta d3$ are set within a range of, for example, 10°-40° depending on the size of the substrate 2, the distances from the substrate 2 to the gas introducing ports 31A-31C, and the like. In particular, a range from 15° to 36.5° is preferable. As an example, when the substrate 2 is φ8-in. sized in diameter, it is preferable that the depression angle $\theta d2$ is set to 15° to 24° toward an outer peripheral region 2b on the surface of the substrate 2, the depression angle $\theta d3$ is set to 29° toward an intermediate region 2c on the surface of the substrate 2, and the depression angle $\theta d1$ is set to 36.5° toward a central region 2a on the substrate 2.

Figure 20:
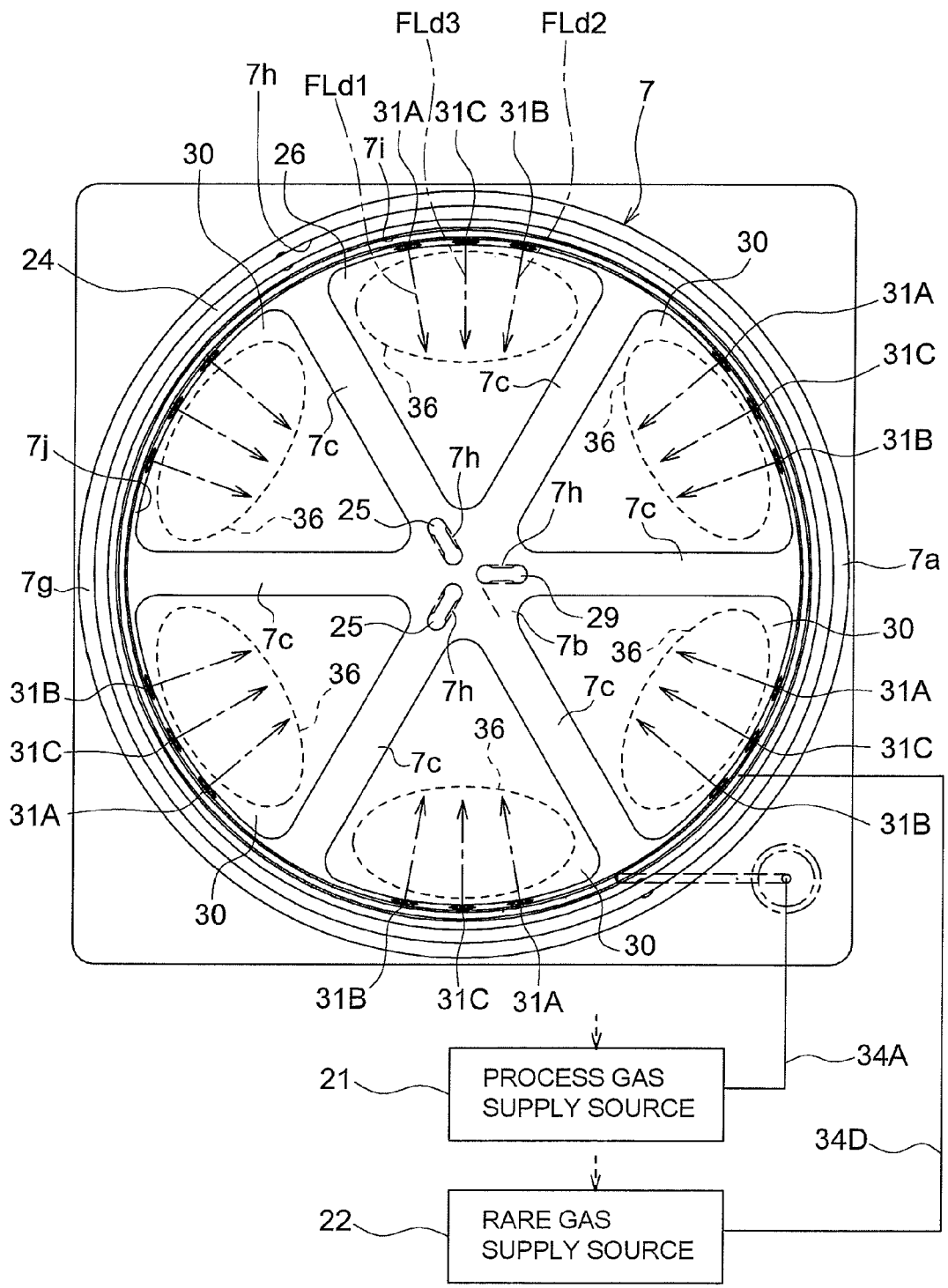
FIG. 20 is a sectional view taken along the line XX-XX of FIG. 10.
Figure 21:
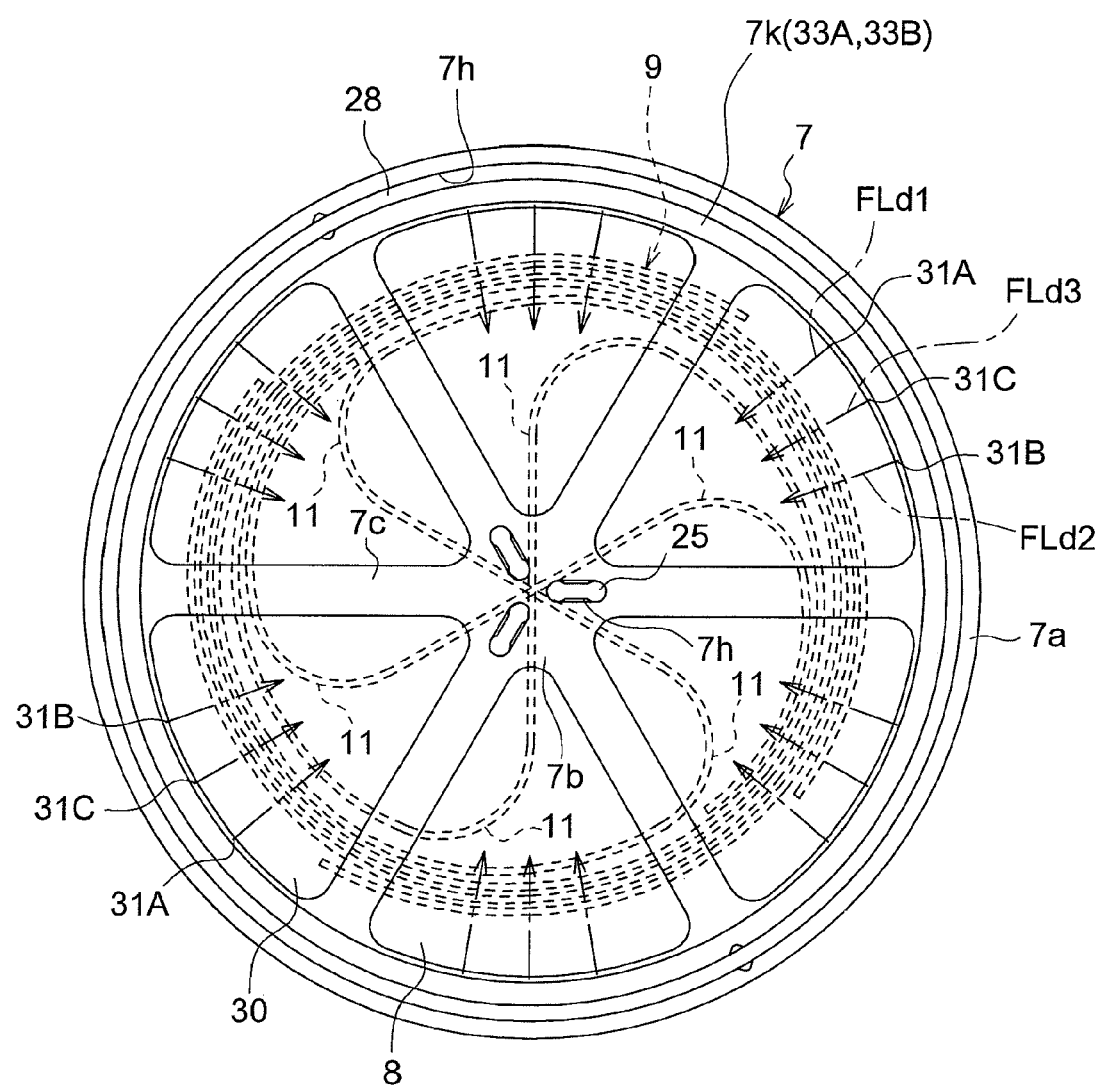
FIG. 21 is a schematic plan view showing a beam-shaped spacer and an ICP coil.
Figure 22:
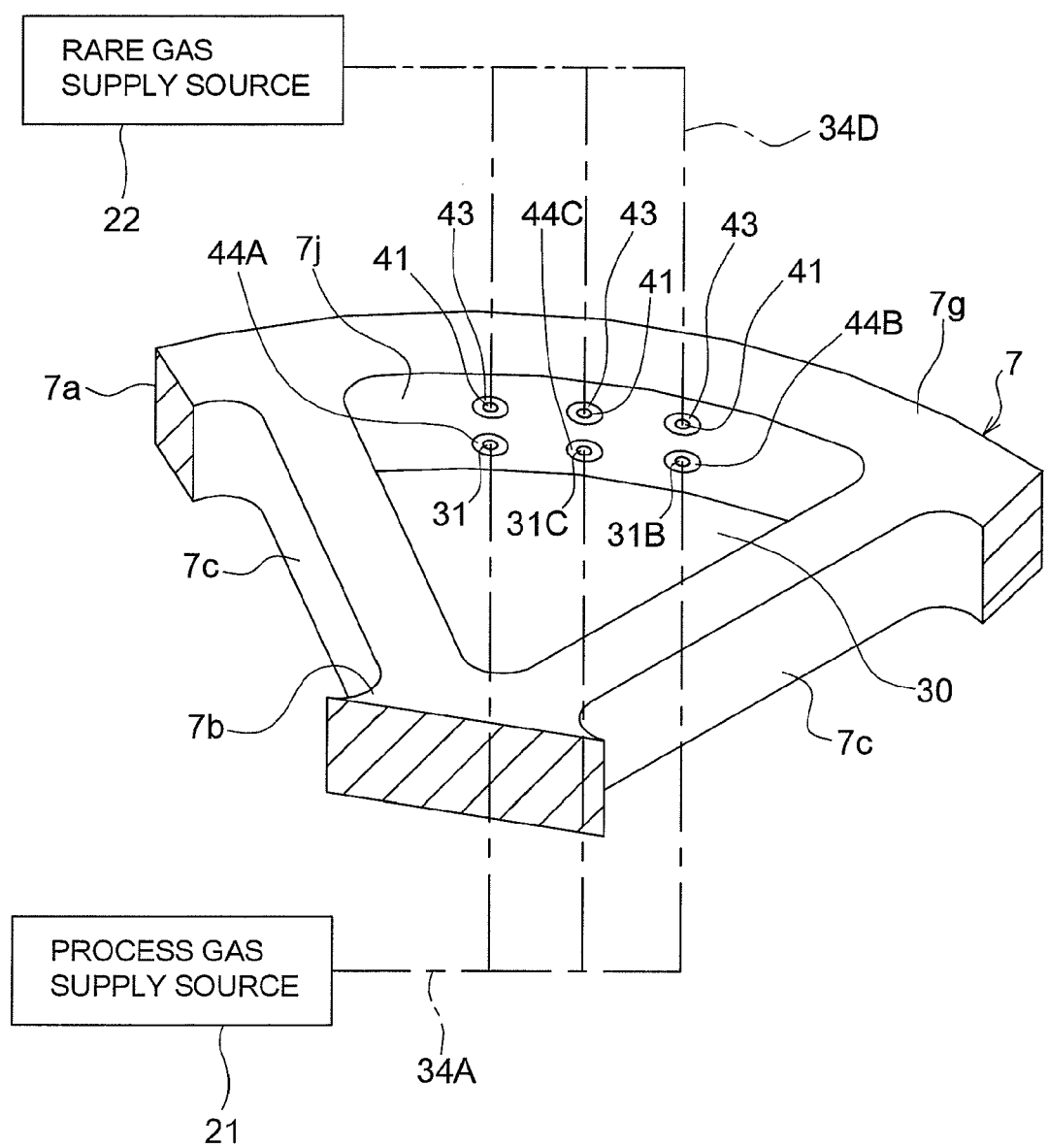
FIG. 22 is a schematic partial perspective view showing the beam-shaped spacer.

As shown in FIGS. 20 and 22, one set of three process gas introducing ports 31A-31C that differ thereamong in depression angles $\theta d1$-$\theta d3$ is provided for each of the six window portions 30. Also, eighteen process gas introducing ports 31A-31C are placed symmetrical with respect to the center of the beam-shaped spacer 7, therefore to the center of the substrate 2, in plane view.

Referring to FIGS. 23A to 23C, each of the process gas introducing ports 31A-31C communicates with the lower-stage side annular gas passage 33A out of the annular gas passages 33A, 33B provided in the outer peripheral portion 7a of the beam-shaped spacer 7. A plurality (18 in this embodiment) of process gas introducing port chips 44A, 44B, 44C (see FIG. 6) are removably or replaceably mounted on the inner side wall surface 7j of the central portion 7b of the beam-shaped spacer 7, and the process gas introducing ports 31A-31C are provided in the individual process gas introducing port chips 44a-44c, respectively. In FIG. 19, although the process gas introducing ports 31A-31C are shown, the process gas introducing port chips 44a-44c are not shown for simplicity's sake.

Referring to FIGS. 19 and 23A, the process gas introducing port 31A provided in the process gas introducing port chip 44a has a depression angle (first depression angle) $\theta d1$ directed toward the central region 2a out of the surface of the substrate 2 on the substrate susceptor 14. Accordingly, as schematically shown by arrow FLd1, the process gas injected from the process gas introducing port 31A flows toward the central region 2a on the surface of the substrate 2.

Referring to FIGS. 19 and 23B, the process gas introducing port 31B provided in the process gas introducing port chip 44B has a depression angle (second depression angle) $\theta d2$ directed toward the outer peripheral region 2b out of the surface of the substrate 2 on the substrate susceptor 14. Accordingly, as schematically shown by arrow FLd2, the process gas injected from the process gas introducing port 31B flows toward the outer peripheral region 2b on the surface of the substrate 2.

Referring to FIGS. 19 and 23C, the process gas introducing port 31C provided in the process gas introducing port chip 44C has a depression angle (third depression angle) $\theta d3$ directed toward the intermediate region 2c between the central region 2a and the outer peripheral region 2b out of the surface of the substrate 2 on the substrate susceptor 14. Accordingly, as schematically shown by arrow FLd3, the process gas injected from the process gas introducing port 31C flows toward the intermediate region 2c on the surface of the substrate 2.

Among the process gas introducing ports 31A-31C formed in the process gas introducing port chips 44a-44c, the flow rate of gas to be injected is varied depending on the depression angles $\theta d1$-$\theta d3$. More specifically, the more the depression angles $\theta d1$-$\theta d3$ are directed toward the central region 2a, the more the flow rate of the process gas to be injected from the process gas introducing ports 31A-31C is set large. In this embodiment, since the process gas is supplied to all the process gas introducing ports 31A-31C via the common annular gas passage 33A, the supply pressure of the process gas supplied from the process gas supply source 19 is of the same among the process gas introducing ports 31A-31C of different depression angles θd1-θd3. Therefore, the flow rate of the injected process gas is varied among the process gas introducing ports 31A-31C by making the process gas introducing ports 31A-31C varied in opening area thereamong.

The process gas introducing port 31A directed toward the central region 2a and having the depression angle θd1, the process gas introducing port 31C directed toward the intermediate region 2c and having the depression angle θd2, and the process gas introducing port 31B directed toward the outer peripheral region 2b and having the depression angle θd2 have a size relationship in this order in terms of their opening areas S1, S2, S3. In other words, the opening area S1 of the process gas introducing port 31A is larger than the opening area S3 of the process gas introducing port 31C, and the opening area S3 of the process gas introducing port 31C is larger than the opening area S2 of the process gas introducing port 31B. By setting the size relationship among the opening areas S1-S3 as shown above under a condition of the same supply pressure, the process gas flow FLd1 from the process gas introducing port 31A having the depression angle θd1 directed toward the central region 2a, the process gas flow FLd3 from the process gas introducing port 31C having the depression angle θd3 directed toward the intermediate region 2c, and the process gas flow FLd2 from the process gas introducing port 31B having the depression angle θd2 directed toward the outer peripheral region 2b have a relationship of flow rate descending in this order.

Next, reasons that high etching rate and uniform etching rate distribution can be obtained in the high-pressure process by the dry etching apparatus 1 of this embodiment are explained.

The conductors 11 constituting the ICP coil 9 are placed dense to each other in the region corresponding to the outer periphery of the dielectric plate 8. Therefore, a toroidal- or doughnut-shaped high-density plasma is generated in the region corresponding to the outer periphery of the ICP coil 9 in a neighborhood of the lower surface of the dielectric plate 8, i.e., in regions of the individual window portions 30 closer to the outer peripheral portion 7a of the beam-shaped spacer 7 in plane view. FIGS. 19 and 20 schematically show the regions 42 where the high-density plasma is generated. The process gas introducing ports 31A-31C are provided in the inner side wall surface 7j facing the window portions 30 of the outer peripheral portion 7a of the beam-shaped spacer 7. In other words, the process gas is injected into the chamber 3 from the process gas introducing ports 31A-31C located in close proximity to the region 42 where the most intense high-frequency electric field is generated from the ICP coil 9. As a result, plasma formation from the process gas is effectively accelerated. Also, since the dielectric plate 8 is supported by the beam-shaped spacer 7 that includes the annular outer peripheral portion 7a, the central portion 7b located at the center of the region surrounded by the outer peripheral portion 7a, and a plurality of beam portions 7c extending radially from the central portion to the outer peripheral portion, the dielectric plate 8 can be reduced in thickness while the mechanical strength is secured in consideration of deformation of the dielectric plate 8 involved in pressure reduction of the interior of the chamber 3. As a result, the loss of applied radio frequency power can be largely reduced so that the plasma can be further densified. These two reasons, that is, high efficiency of plasma formation from the process gas and extremely low loss of applied radio frequency power make it possible to realize high etching rate.

In the region 42 (high-density plasma generation region), where the doughnut-shaped high-density plasma is generated, corresponding to the outer peripheral side of the ICP coil 9 out of the neighborhood of the lower surface of the dielectric plate 8, radicals are generated at high density, and the generated radicals are supplied to the substrate 2 by the process gas flows FLd1-FLd3 injected mainly from the process gas introducing ports 31A-31C.

In this case, the shorter the process gas resides on the substrate 2, the higher the ratio is at which reaction products generated by etching of the substrate 2 are exhausted outside the substrate 2 without being redeposited in the pattern. Also, because the gas flow is viscous in the high-pressure process, the velocity distribution of the process gas on the substrate 2 in the high-pressure process tends to be such that the flow is more stagnated on the central region 2a side of the substrate 2 while being higher in velocity on the outer peripheral region 2b side. That is, with a uniform flow of the process gas given to the substrate 2, the pressure distribution of the process gas on the substrate 2 becomes such that the pressure is higher on the central region 2a side and lower on the outer peripheral region 2b side (FIG. 32A), so that the residence time of the process gas in the high-pressure process is longer in the central region 2a of the substrate 2, next longer in the intermediate region 2c of the substrate 2, and shorter in the outer peripheral region 2b (FIG. 32B). Therefore, with a uniform flow of the process gas given to the substrate 2 in the high-pressure process, the redeposition amount of reaction products is larger in the central region 2a of the substrate 2, next larger in the intermediate region 2c, and smaller in the outer peripheral region 2b (FIG. 32C). Thus, the etching rate in the central region 2a of the substrate is lower, and the etching rate in the intermediate region 2c of the substrate is next lower, resulting in a nonuniform in-plane distribution (FIG. 32D).

Figure 33A:
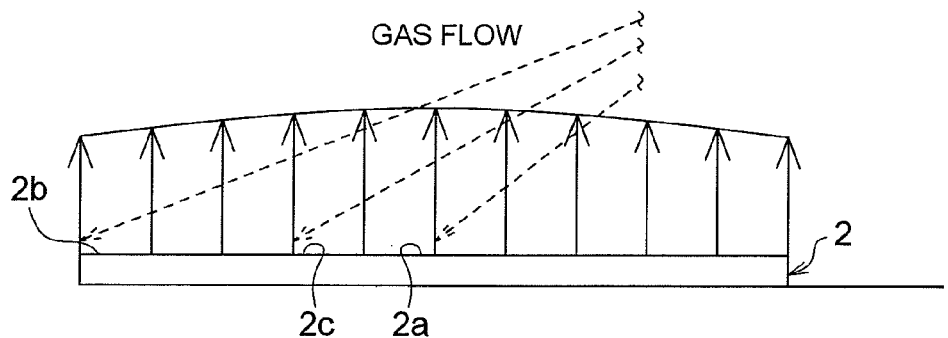
FIG. 33A is a view of an in-plane distribution of gas pressure.
Figure 33B:
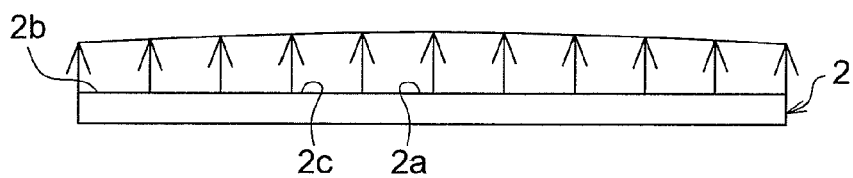
FIG. 33B is a view of an in-plane distribution of gas residence time.
Figure 33C:
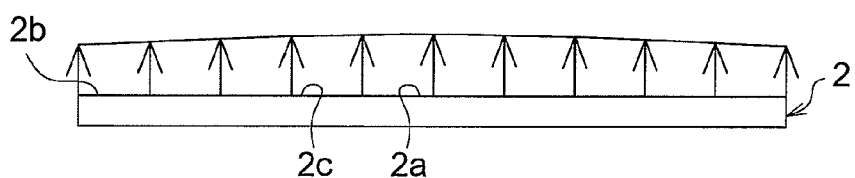
FIG. 33C is a view of an in-plane distribution of reactant redeposition amount.
Figure 33D:
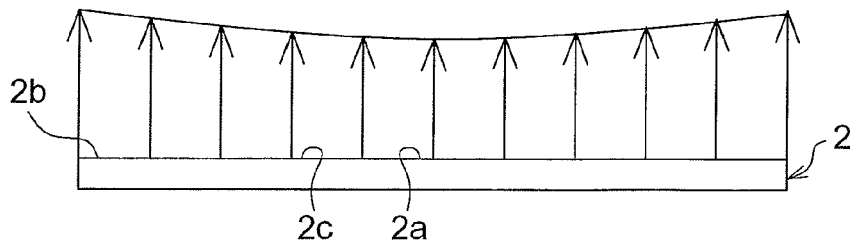
FIG. 33D is a view of an in-plane distribution of etching rate.

In contrast to this, the dry etching apparatus 1 of this embodiment has three types of process gas introducing ports 31A, 31B, 31C having the depression angles θd1, θd2, θd3 directed toward the central region 2a, the outer peripheral region 2b and the intermediate region 2c of the surface of the substrate 2, respectively. Therefore, not only radicals are supplied to the outer peripheral region 2b by the process gas flow FLd2 derived from the process gas introducing port 31B, but also radicals are supplied to the central region 2a and the outer peripheral region 2b by the process gas flows FLd1, FLd3 derived from the process gas introducing ports 31A, 31C, respectively. Because of three types (θd1, θd2, θd3) provided as the depression angles of those process gas introducing ports 31A-31C, when the introduction amount of the process gas to the outer peripheral region 2b side of the substrate 2 is set larger than the introduction amount of the process gas to the central region 2a side of the substrate 2 and then the introduction amount of the process gas to the intermediate region 2c of the substrate 2 is set larger, it becomes achievable to lower the process gas pressure in the central region 2a and the intermediate region 2c of the substrate 2 relative to the gas pressure in the outer peripheral region 2b of the substrate 2 (FIG. 33A), and to thereby reduce the stagnation of the process gas in the central region 2a and the intermediate region 2c of the substrate 2 (FIG. 33B). As a result, the residence time of reaction products on the substrate 2 can be uniformized, so that the redeposition amount of reaction products onto the substrate 2 can be uniformized (FIG. 33C). As a result, the etching rate in-plane distribution can be uniformized in the high-pressure process (FIG. 33D).

Further, as described before, there is a relationship of flow rate, as listed from highest to lowest, among the process gas flow FLd1 from the process gas introducing port 31A having the depression angle θd1 directed toward the central region 2a, the process gas flow FLd3 from the process gas introducing port 31C having the depression angle θd3 directed toward the intermediate region 2c, and the process gas flow FLd2 from the process gas introducing port 31B having the depression angle θd2 directed toward the outer peripheral region 2b, in this order. As a result of this flow rate setting among the process gas flows FLd1-FLd3, the amounts of radicals supplied to the central region 2a and the intermediate region 2c are increased relative to the amount of radicals supplied to the outer peripheral region 2b, so that etching rate uniformization among the central region 2a, the outer peripheral region 2b and the intermediate region 2c can be achieved. Also, since the introduction amount of the process gas to the central region 2a or the intermediate region 2c of the substrate 2 can be further increased in comparison to the introduction amount of the process gas to the outer peripheral region 2b of the substrate 2, the stagnation of the process gas in the central region 2a and the intermediate region 2c can be further reduced, so that uniformization of the etching rate can be achieved.

Figure 24:
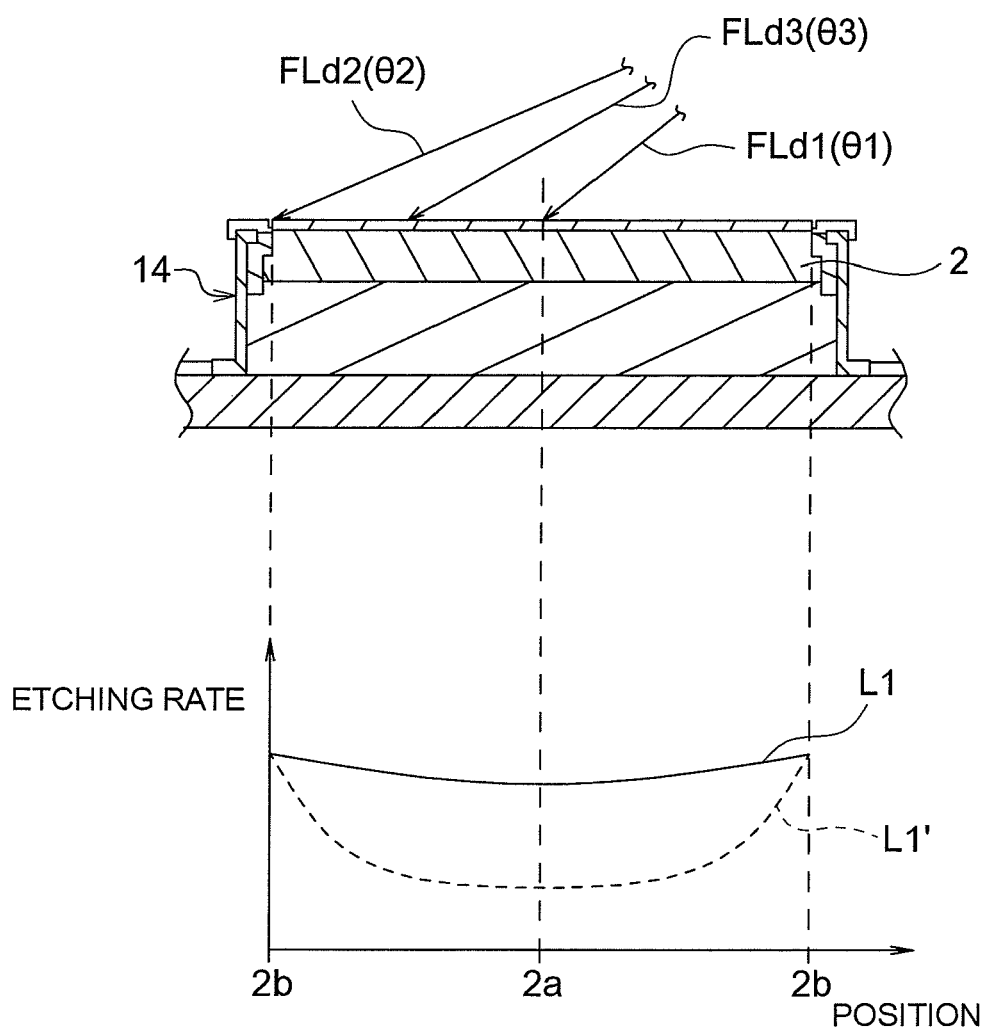
FIG. 24 is a schematic view showing an etching rate distribution.
Figure 25:
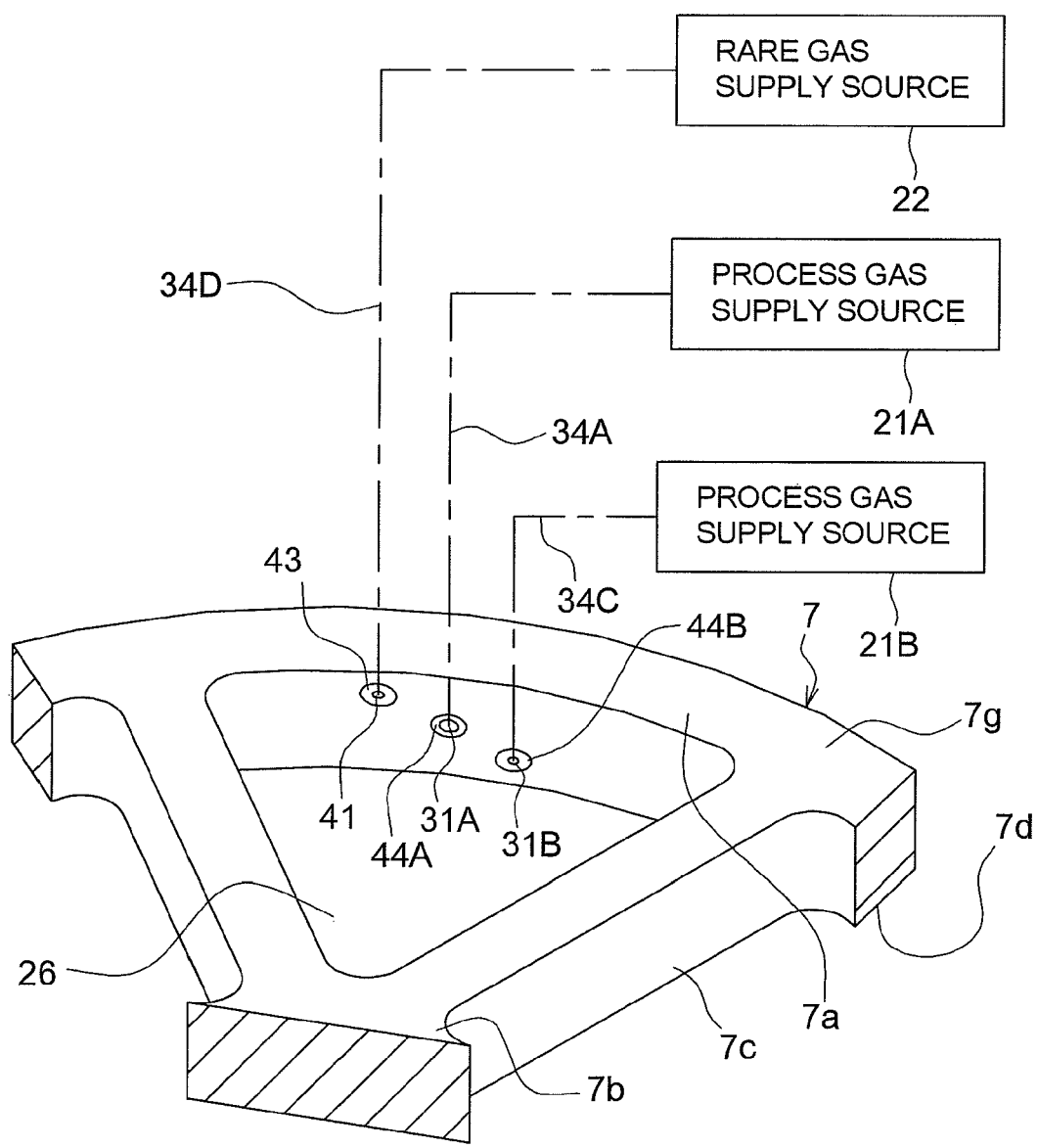
FIG. 25 is a schematic partial perspective view showing a beam-shaped spacer included in the dry etching apparatus according to the seventh embodiment of the invention.

As described above, because of a chief reason that the process gas introducing ports 31A-31C have a plurality of depression angles θd1-θd3 and moreover because the flow rate of the process gas injected from the process gas introducing ports 31A-31C are set increasingly higher with increasing degree to which the depression angles θd1-θd3 are directed toward the central region 2a, it becomes achievable to effectively uniformize the distribution of residence time of reaction products among the central region 2a, the outer peripheral region 2b and the intermediate region 2c, thus making it possible to uniformize the etching rate distribution. More specifically, as schematically shown by signal line L1 in FIG. 24, a uniform etching rate distribution with very small differences in etching rate among the central region 2a, the outer peripheral region 2b and the intermediate region 2c can be realized.

By the rare gas being injected from the rare gas introducing ports 41 toward the lower surface 8a of the dielectric plate 8 in the neighborhood of the high-density plasma generation region 42, etching or wear of the dielectric plate 8 is effectively prevented, as in the first embodiment.

Eighth Embodiment

In an eighth embodiment of the invention shown in FIG. 25 and FIGS. 26A-26C, the gas passage groove 7k has, on a lower side of the lower-side portion 7m, a bottom-side portion 7r of a narrower width. The lower-side portion 7m and the bottom-side portion 7r are cut off from each other by an O-ring 25C. Accordingly, the gas passage groove 7k is divided into three annular gas passages 33A, 33B, 33C. The annular gas passages 33A, 33B, 33C are connected to their corresponding gas supply sources, respectively, via independent-line introducing passages 34A-34C cut off from one another. More specifically, the annular gas passages 33A, 33C are connected to independent process gas supply sources 21A, 21B via the introducing passages 34A, 34C, respectively. Also, the annular gas passage 33B is connected to the rare gas supply source 22 via an independent introducing passage 34D.

Figure 26A:
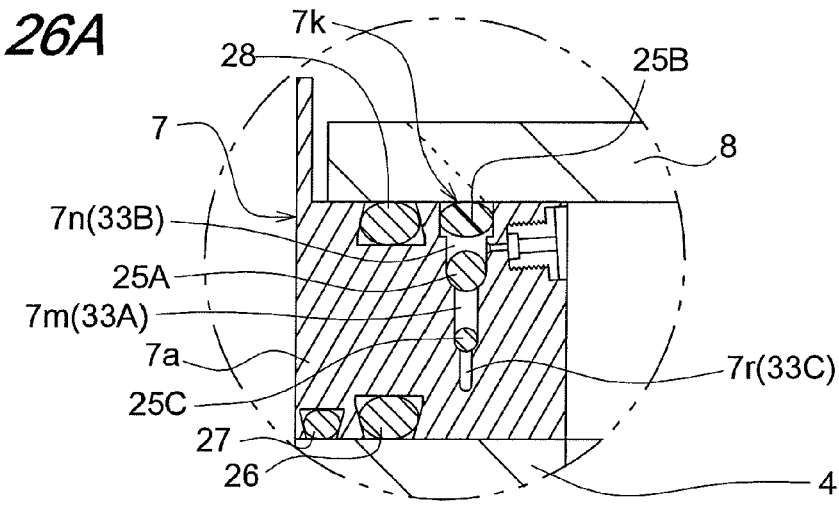
FIG. 26A is a partially enlarged sectional view showing a rare gas introducing port chip.
Figure 26B:
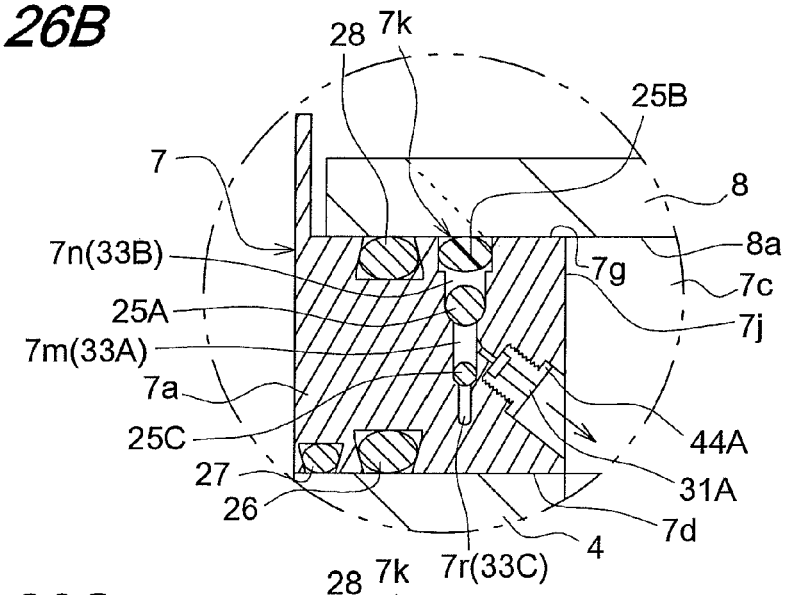
FIG. 26B is a partially enlarged sectional view showing a process gas introducing port chip.
Figure 26C:
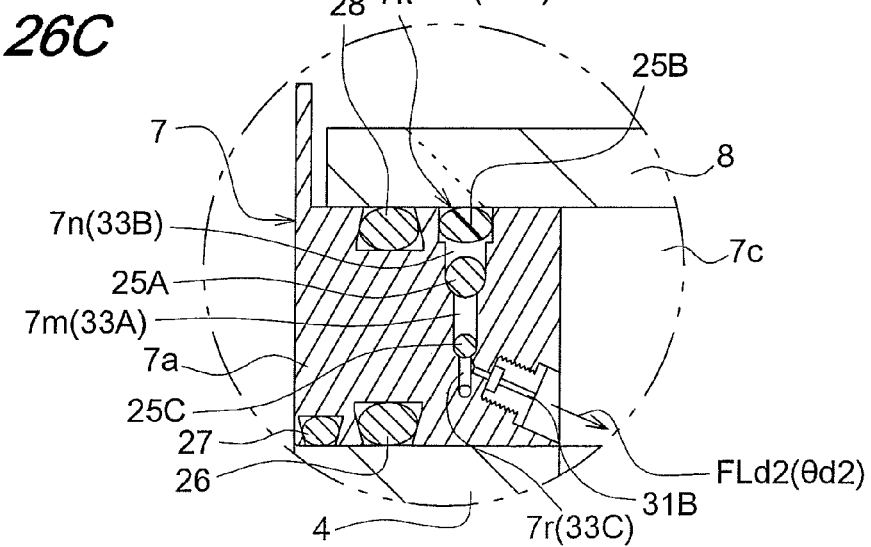
FIG. 26C is a partially enlarged sectional view showing a process gas introducing port chip.

As shown in FIG. 26A, a fitting hole 50 of the rare gas introducing port chip 43 is provided also in such a manner that the rare gas introducing port 41 having the elevation angle θe directed toward the lower surface 8a of the dielectric plate 8 is communicated with the annular gas passage 33B. A rare gas of the rare gas supply source 22 is injected from the rare gas introducing ports 41. Also, as shown in FIG. 26B, the fitting hole 50 of the process gas introducing port chip 44a and the process gas introducing port 31A having the depression angle θd1 directed toward the central region 2a of the substrate 2 are provided so as to communicate with the annular gas passage 33A. A process gas from the process gas supply source 21A is injected from the gas introducing port 31A of the depression angle θd1. Further, as shown in FIG. 26C, the fitting hole 50 of the process gas introducing port chip 44B is provided in such a manner that the process gas introducing port 31B having the depression angle θd2 directed toward the outer peripheral region 2b of the substrate 2 communicates with the annular gas passage 33C. A process gas of the process gas supply source 21B is injected from the process gas introducing port 31B of the depression angle θd2.

As described before, the process gas is supplied from the independent process gas supply sources 21A, 21B to the process gas introducing ports 31A, 31B. Therefore, flow rates of the process gas injected from the individual process gas introducing ports 31A, 31B can be controlled individually by adjusting supply pressures of the process gas from the process gas supply sources 21A, 21B, respectively. Also, even if the opening areas S1, S2 of the process gas introducing ports 31A, 31B are of the same, the flow rates of the process gas injected from the process gas introducing ports 31A, 31B can be set increasingly larger with increasing degree to which the depression angles θd1, θd2 are directed toward the central region 2a as in the seventh embodiment. In this case, the supply pressure of the process gas of the process gas supply source 21A for the process gas introducing port 31A having the depression angle θd1 directed toward the central region 2a may appropriately be set higher than the supply pressure of the process gas of the process gas supply source 21B for the process gas introducing port 31B having the depression angle θd2 directed toward the outer peripheral region 2b.

Also, since the process gas is supplied from the independent process gas supply sources 21A, 21B to the gas introducing ports 31A, 31B, respectively, the process gases injected from the process gas introducing ports 31A, 31B, respectively, may be made different in type from each other depending on the depression angles θd1, θd2 by making the process gases supplied from the process gas supply sources 21A-21B, respectively, different in type from each other.

As in the eighth embodiment, with provision of the process gas introducing ports 31A-31C having three types of different depression angles θd1-θd3, process gas may be supplied from the independent process gas supply sources 21A-21C to those process gas introducing ports 31A-31C, respectively.

The rest of construction and function of the eighth embodiment are similar to those of the seventh embodiment.

Ninth Embodiment

Figure 27:
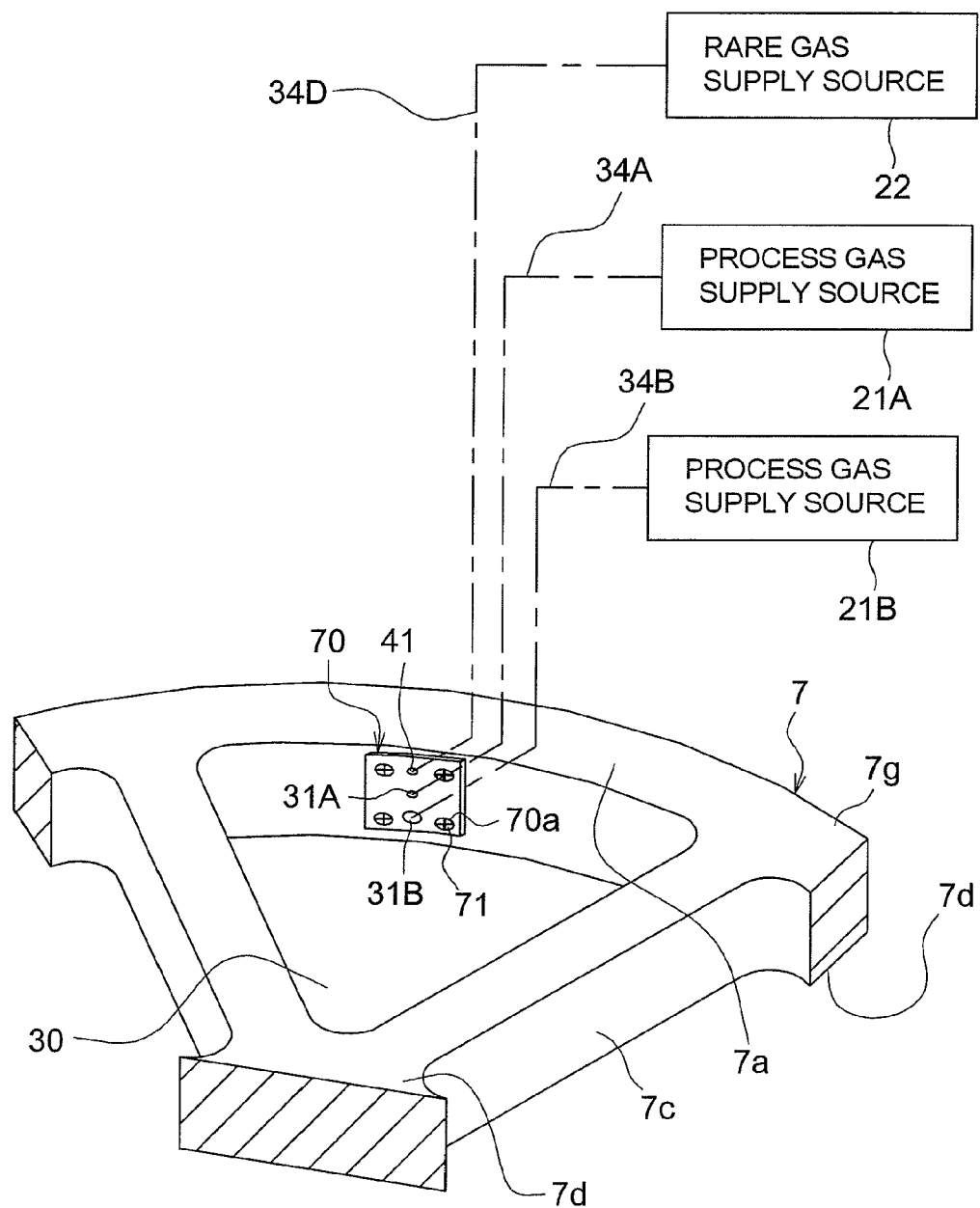
FIG. 27 is a schematic partial perspective view showing a beam-shaped spacer included in a dry etching apparatus according to an eighth embodiment of the invention.
Figure 28:
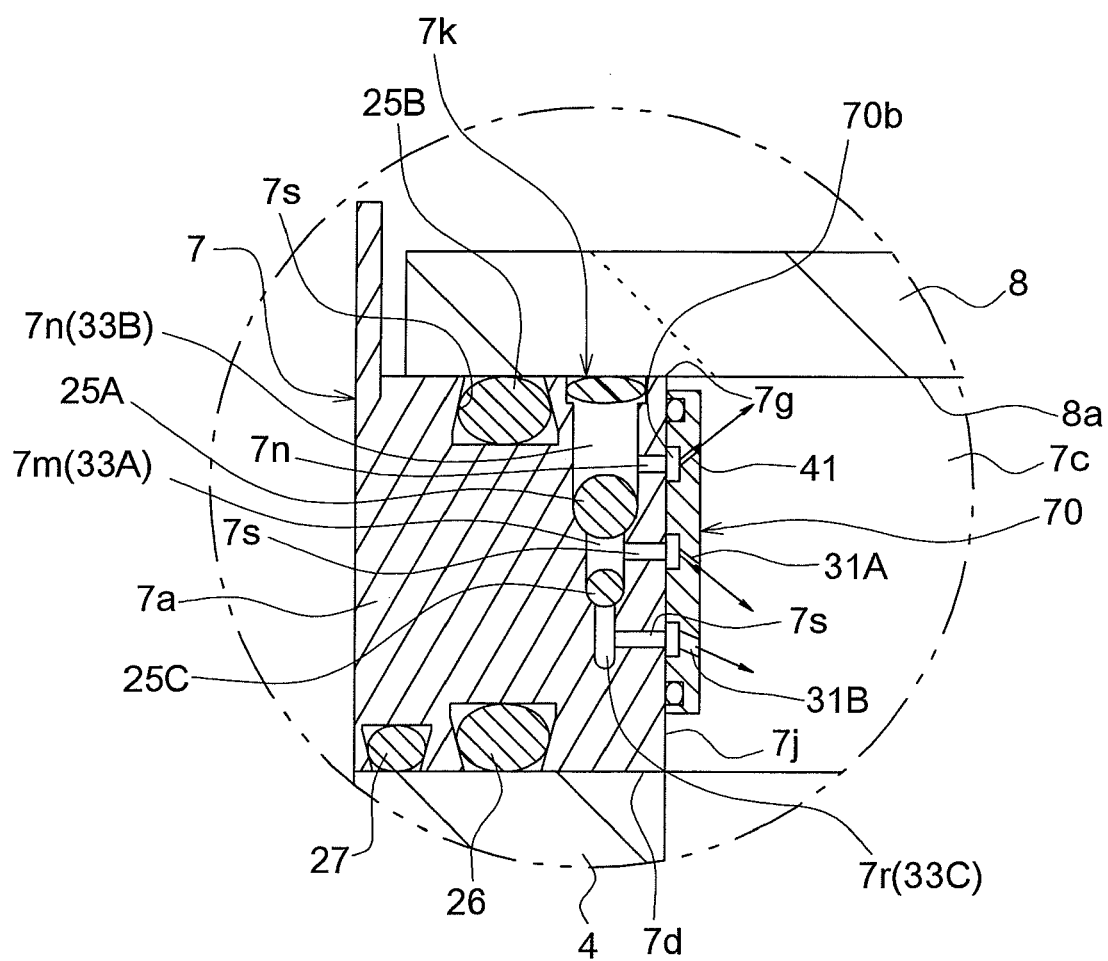
FIG. 28 is a partially enlarged sectional view showing an introducing port chip.

In a ninth embodiment of the invention shown in FIGS. 27 and 28, as in the eighth embodiment, three annular gas passages 33A, 33C connected to a rare gas supply source 22 and process gas supply sources 21A, 21B, respectively, are provided in the beam-shaped spacer 7.

In this embodiment, a rare gas introducing port 41 and two process gas introducing ports 31A, 31B having different depression angles θd1, θd2 are provided in a single introducing port chip 70. The introducing port chip 70 has a curved plate shape suited to the inner side wall surface 7j of the outer peripheral portion 7a of the beam-shaped spacer 7, and screws 71 inserted into four-corner through holes 70a are screwed into female screw portions (not shown) formed on the inner side wall surface 7j side so as to be removably or replaceably mounted on the inner side wall surface 7j. Three recess portions 70b for gas collection are provided in a surface of the introducing port chip 70 brought into contact with the inner side wall surface 7j of the outer peripheral portion 7a of the introducing port chip 70, and the rare gas introducing port 41 and the process gas introducing ports 31A, 31B extend from those recess portions 70b.

Also, in the outer peripheral portion 7a of the beam-shaped spacer 7 are provided three passage holes 7s whose one end is opened in the inner peripheral wall 33b of the annular gas passages 33A, 33B, 33C and whose other end communicates with the gas introducing ports 31A-31C via the recess portion 42b. From the annular gas passages 33A-33C to the interior of the chamber 3 are the passage holes 7s, a recess portion 42b of the introducing port chip 42, and the gas introducing ports 41, 31A, 31B.

The rest of construction and function of the ninth embodiment are similar to those of the eighth embodiment. In the seventh to ninth embodiments, the oxygen gas introducing ports and the oxygen gas supply source may also be adopted, as in the sixth embodiment, instead of the rare gas introducing ports and the rare gas supply source.

Selection of the antiwear gas to be blown to the lower surface 8a of the dielectric plate 8 for prevention of cuts needs to satisfy a condition of low reactivity with the material of the dielectric plate 8 (i.e., a property of not cutting or chipping the dielectric plate 8) from the viewpoint of prevention of cuts of the dielectric plate 8. For example, when the dielectric plate 8 is made of quartz ($SiO_2$), the relevant antiwear gas to be blown is He, Ar or other rare gas, as in the first embodiment, and/or $O_2$, as in the sixth embodiment. Also, the antiwear gas is preferably selected in terms of etching by the condition that the gas is contained in the process gas, and/or by the condition that the gas is a rare gas (containing at least one kind selected from a group of He, Ar, Xe and Ne) occupying a large ratio to a total flow rate. For example, if the dielectric plate 8 is made of $SiO_2$ and the etching-targeted film is made of Si and the mixed gas of the process gas and the rare gas is $SF_6/O_2/H_e$, then the gas to be blown for prevention of cuts of the dielectric plate 8 is preferably selected as at least one of $O_2$ and He, which is a rare gas. Further, if the dielectric plate 8 is made of $SiO_2$ and the etching-targeted film is made of Si and the mixed gas of the process gas and the rare gas is $SF_6/O_2$, which contains no rare gas (He), then the gas to be blown for prevention of cuts of the dielectric plate 8 is preferably selected as $O_2$ gas. Besides, if the dielectric plate is made of $SiO_2$ and the etching-targeted film is made of $SiO_2$ and the mixed gas of the process gas and the rare gas is $CF_4/Ar$, then the gas to be blown for prevention of cuts of the dielectric plate is preferably selected as Ar, which is a rare gas.

Tenth Embodiment

A dry etching apparatus according to a tenth embodiment of the invention shown in FIG. 35 includes a generally cylindrical-shaped frame body (support structure) 117 in plane view instead of the beam-shaped spacer 7. In more detail, the lid 6 that seals the upper opening of the chamber main body 4 includes a frame body 117 supported on an upper end of a side wall of the chamber main body 4, and a disc-shaped dielectric plate 8 whose lower surface near its outer peripheral edge is supported by the frame body 117. A region surrounded by the spacer 7 constitutes a window portion 118 from which the lower surface 8a of the dielectric plate 8 is exposed when viewed from the substrate susceptor side. The process gas and the rare gas are introduced into the chamber 3 from process gas introducing ports 31A-31B and a rare gas introducing port 41 provided in the frame body 117 (corresponding to the outer peripheral portion 7a of the beam-shaped spacer 7 in the first to ninth embodiments).

In a case where the dielectric plate 8 is large in thickness and strong enough to support by itself the atmospheric pressure acting thereon in the pressure reduction of the interior of the chamber 3, it is also possible to adopt a structure that the dielectric plate 8 is supported by the frame body 117 alone instead of the beam-shaped spacer 7 as in this embodiment. In this case, with a view to enhancing the transmittability of the induced magnetic field for plasma generation, a recess portion may be formed by partly decreasing the thickness of the dielectric plate 8. When the recess portion is provided in a region where the distribution of the conductors 11 constituting the ICP coil 9 is dense, the transmittability of the induced magnetic field can effectively be improved.

The rest of construction and function of the tenth embodiment are similar to those of the seventh embodiment (FIG. 19). Therefore, like component members are designated by like reference signs and their description is omitted.

The present invention may be modified in various ways as exemplarily listed below without being limited to the foregoing embodiments.

Figure 29:
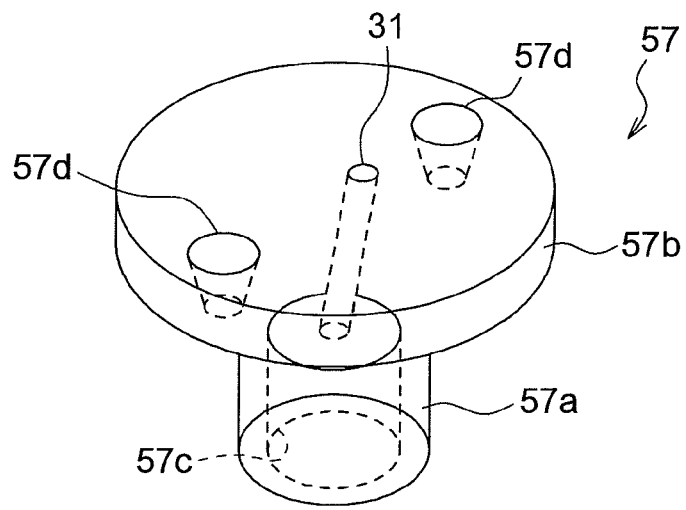
FIG. 29 is a perspective view showing an alternative introducing port chip.
Figure 30:
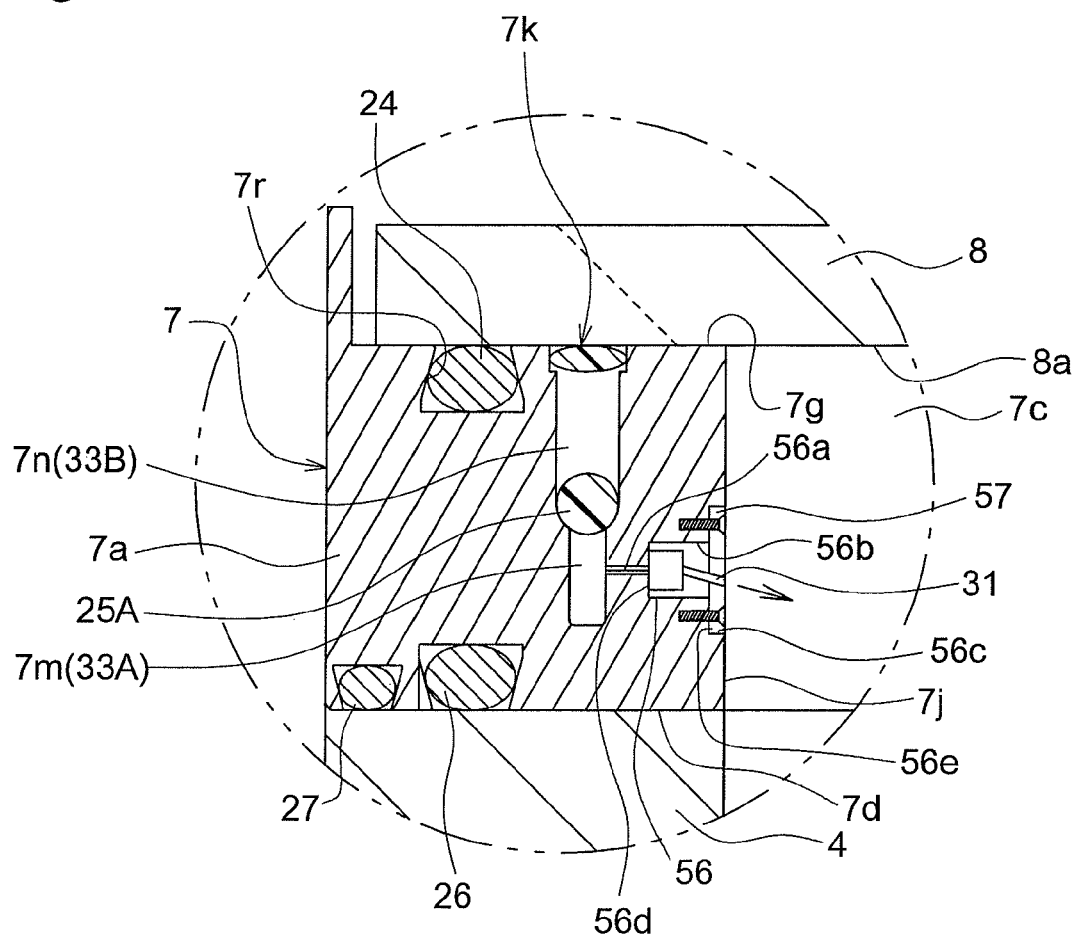
FIG. 30 is a partially enlarged sectional view showing an alternative introducing port chip.

FIGS. 29 and 30 shows an alternative process gas introducing port chip. In this alternative, a plurality of fitting holes 56 of a circular cross section are provided in the outer peripheral portion 7a of the beam-shaped spacer 7 so as to extend horizontally from the inner peripheral wall of an annular gas passage 33A to the inner side wall surface 7j of the beam-shaped spacer 7. Each of the fitting holes 56 has, in this order from the annular gas passage 33A side, an inlet portion 56a communicating with the annular gas passage 33A, an intermediate portion 56b larger in diameter than the inlet portion 56a, and an outlet portion 56c larger in diameter than the intermediate portion 56b. Seat portions 56d, 56e are formed at a connecting portion between the inlet portion 56a and the intermediate portion 56b and a connecting portion between the intermediate portion 56b and the outlet portion 56c, respectively.

An introducing port chip 57 has an axis portion 57a, and a head portion 57b provided at a forward end of the axis portion 57a. The head portion 57b is larger in diameter than the axis portion 57a. A recess portion 57c is formed in a base end surface of the axis portion 57a. A process gas introducing port 31 is formed so as to extend through from a bottom wall of the recess portion 57c to a forward end surface of the head portion 57b. The process gas introducing port 31 is so formed as to be tilted with respect to a center axis of the introducing port chip 57. Two through holes 57d are provided at the head portion 57b of the introducing port chip 57. The introducing port chip 57 is inserted into the fitting hole 56 so that the axis portion 57a is received by the intermediate portion 56b and the head portion 57b is received by the outlet portion 56c. Also, the base end lower surface of the axis portion 57a is placed on the seat portion 56d, and the base end surface of the head portion 57b is placed on the seat portion 56e.

The two screws 58 passed into the through holes 57d of the head portion 57b are screwed into screw holes formed in the inner side wall surface 7j of the outer peripheral portion 7a of the beam-shaped spacer 7, by which the process gas introducing port chip 57 is fixed to the outer peripheral portion 7a of the beam-shaped spacer 7. Also, by these screws 58, the rotational angle position of the process gas introducing port chip 57 itself about its center line is fixed, i.e., the orientation of the process gas introducing port 31 is fixed. Such a structure as shown in FIGS. 29 and 30 may be adopted also for the rare gas and oxygen gas introducing port chips.

Figure 31A:
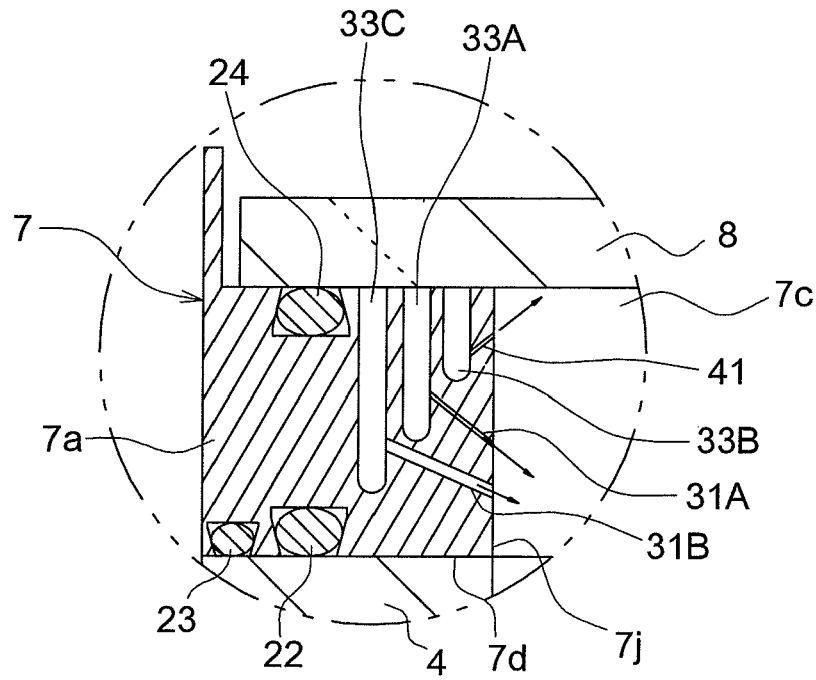
FIG. 31A is a partially enlarged sectional view showing an alternative gas introducing port.
Figure 31B:
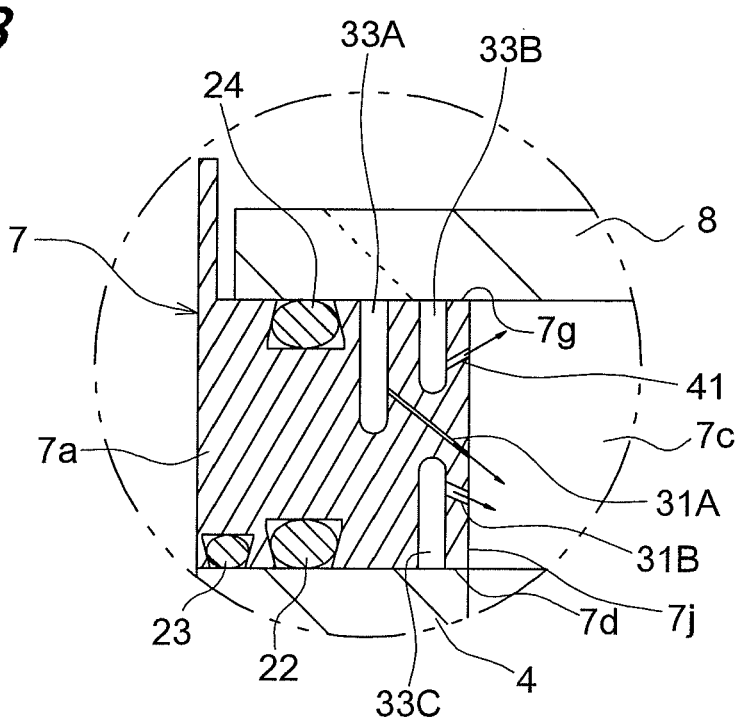
FIG. 31B is a partially enlarged sectional view showing an alternative gas introducing port.

FIGS. 31A and 31B show alternative gas introducing ports. In these alternatives, the introducing ports 31A, 31B, 41 are formed in the outer peripheral portion 7a of the beam-shaped spacer 7. In the alternative of FIG. 31A, three independent gas passage grooves formed on the upper surface 7g of the outer peripheral portion 7a of the beam-shaped spacer 7 constitute annular gas passages 33A-33C. In the alternative of FIG. 31B, annular gas passages 33A, 33B are constituted by two independent gas passage grooves, respectively, on the upper surface 7g of the outer peripheral portion 7a of the beam-shaped spacer 7, while the annular gas passage 33C is constituted by one gas passage groove formed in the lower surface 7d of the outer peripheral portion 7a of the beam-shaped spacer 7.

Although the depression angles of the process gas introducing ports are in three types at most in the above embodiment, it is also possible that with increased two or more types of depression angles directed toward the intermediate region 2c of the substrate 2, four or more types of depression angles may be set by a combination of those directed toward the central region 2a and those directed toward the central region 2a of the substrate 2.

Process gas introducing ports, rare gas introducing ports, or oxygen gas introducing ports may be formed directly in the outer peripheral portion or central portion of the beam-shaped spacer. Also, the present invention has been described on dry etching apparatuses of the ICP type as an example, yet the invention may also be applied to plasma CVD apparatuses or other plasma processing apparatuses.

Although the present invention has been fully described in conjunction with preferred embodiments thereof with reference to the accompanying drawings, various changes and modifications are apparent to those skilled in the art. Such changes and modifications should be construed as included therein unless they depart from the scope of the invention as defined by the appended claims.

The invention claimed is:

1. A dry etching method for processing a substrate by plasma, comprising:
   providing the substrate on a bottom portion side of a vacuum vessel;
   placing a beam-shaped structure at an upper opening of the vacuum vessel opposed to the substrate, the beam-shaped structure having an annular outer peripheral portion with a lower surface supported by the vacuum vessel, a central portion located at a center of a region surrounded by the outer peripheral portion in plane view, and a plurality of beam portions extending radially from the central portion to the outer peripheral portion, wherein a region surrounded by the outer peripheral portion, the central portion and the beam portions constitute a window portion;
   providing a dielectric plate so that its lower surface is supported by an upper surface of the beam-shaped structure;
   providing a spiral coil for plasma generation on an upper surface side of the dielectric plate;
   injecting a process gas into the vacuum vessel from a plurality of process gas introducing ports provided in the beam-shaped structure so as to face downward and each have a depression angle directed toward the substrate;
   injecting an antiwear gas, which includes at least a rare gas, toward a lower surface of the dielectric plate from a plurality of antiwear gas introducing ports which are provided so as to face upward and confront the window portion of the beam-shaped structure and each of which has an elevation angle directed toward the dielectric plate;
   while injecting the process gas from the process gas introducing ports and injecting the antiwear gas from the antiwear gas introducing ports, evacuating an interior of the vacuum vessel to maintain the interior of the vacuum vessel at a constant pressure; and
   applying a radio frequency power to the spiral coil to generate plasma in the vacuum vessel so that radicals in the plasma are adsorbed to the substrate and ions in the plasma collide with the substrate, thereby resulting in a surface of the substrate being etched,
   wherein the antiwear gas injected from the antiwear gas introducing ports is directed to a neighborhood of a high-density plasma generation region generated in a region below the dielectric plate and corresponding to an outer periphery of the spiral coil.

2. The dry etching method according to claim 1, wherein the process gas introducing ports include gas introducing ports having at least two kinds of depression angles.

3. The dry etching method according to claim 1, wherein at least either ones of the process gas introducing ports or the antiwear gas introducing ports are formed in introducing port members replaceably mounted on the beam-shaped structure.

* * * * *